United States Patent
Dedic et al.

(10) Patent No.: US 7,746,259 B2
(45) Date of Patent: Jun. 29, 2010

(54) SWITCHING CIRCUITRY

(75) Inventors: Ian Juso Dedic, Northolt Middlesex (GB); Darren Walker, Reading Berkshire (GB)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 12/179,392

(22) Filed: Jul. 24, 2008

(65) Prior Publication Data
US 2009/0051576 A1 Feb. 26, 2009

(30) Foreign Application Priority Data
Jul. 27, 2007 (EP) .................. 07113379

(51) Int. Cl.
*H03M 1/66* (2006.01)
(52) U.S. Cl. ....................... 341/144; 341/136
(58) Field of Classification Search ........... 341/144, 341/154, 131, 136
See application file for complete search history.

(56) References Cited

U.S. PATENT DOCUMENTS

| | | | |
|---|---|---|---|
| 4,607,248 A * | 8/1986 | Botka et al. ............... 341/133 |
| 4,751,497 A * | 6/1988 | Torii .......................... 341/154 |
| 5,625,360 A * | 4/1997 | Garrity et al. ............. 341/144 |
| 6,218,892 B1 | 4/2001 | Soumyanath et al. |
| 6,272,666 B1 | 8/2001 | Borkar et al. |
| 2001/0052623 A1 | 12/2001 | Kameyama et al. |
| 2005/0280083 A1 | 12/2005 | Vogelsang |

FOREIGN PATENT DOCUMENTS

EP   1 292 035 A2   3/2003

OTHER PUBLICATIONS

Hendrawan Soeleman et al; "*Robust Subthreshold Logic for Ultra-Low Power Operation*"; IEEE Transactions on Very Large Scale Integration (VLSI) Systems, IEEE Service Center; Feb. 2001; vol. 9; No. 1; Piscataway, NJ; US;.

* cited by examiner

*Primary Examiner*—Brian Young
(74) *Attorney, Agent, or Firm*—Arent Fox LLP

(57) ABSTRACT

A digital-to-analog converter, comprising: a first field-effect transistor; a second field-effect transistor; and adjusting means for adjusting a bulk voltage applied to at least one of the first and second field-effect transistors so as to tend to equalise respective switching delays of the transistors.

31 Claims, 17 Drawing Sheets

|   | PHASE 1 | PHASE 2 | PHASE 3 | PHASE 4 | PHASE 5 | PHASE 6 | PHASE 7 | PHASE 8 |
|---|---|---|---|---|---|---|---|---|
| A |   | S1 |   | S1 |   | S1 |   | S1 |
| B | S2 |   | S4 |   | S6 |   | S8 |   |

FIG. 11(A)

|   | PHASE 1 | PHASE 2 | PHASE 3 | PHASE 4 | PHASE 5 | PHASE 6 | PHASE 7 | PHASE 8 |
|---|---|---|---|---|---|---|---|---|
| A |   | S3 |   | S3 |   | S3 |   | S3 |
| B | S2 |   | S4 |   | S6 |   | S8 |   |

FIG. 11(B)

|   | PHASE 1 | PHASE 2 | PHASE 3 | PHASE 4 | PHASE 5 | PHASE 6 | PHASE 7 | PHASE 8 |
|---|---|---|---|---|---|---|---|---|
| A |   | S5 |   | S5 |   | S5 |   | S5 |
| B | S2 |   | S4 |   | S6 |   | S8 |   |

FIG. 11(C)

|   | PHASE 1 | PHASE 2 | PHASE 3 | PHASE 4 | PHASE 5 | PHASE 6 | PHASE 7 | PHASE 8 |
|---|---|---|---|---|---|---|---|---|
| A |   | S7 |   | S7 |   | S7 |   | S7 |
| B | S2 |   | S4 |   | S6 |   | S8 |   |

FIG. 11(D)

|   | PHASE 1 | PHASE 2 | PHASE 3 | PHASE 4 | PHASE 5 | PHASE 6 | PHASE 7 | PHASE 8 |
|---|---|---|---|---|---|---|---|---|
| A |  | S1 |  | S3 |  | S5 |  | S7 |
| B | S2 |  | S2 |  | S2 |  | S2 |  |

FIG. 11(E)

|   | PHASE 1 | PHASE 2 | PHASE 3 | PHASE 4 | PHASE 5 | PHASE 6 | PHASE 7 | PHASE 8 |
|---|---|---|---|---|---|---|---|---|
| A |  | S1 |  | S3 |  | S5 |  | S7 |
| B | S4 |  | S4 |  | S4 |  | S4 |  |

FIG. 11(F)

|   | PHASE 1 | PHASE 2 | PHASE 3 | PHASE 4 | PHASE 5 | PHASE 6 | PHASE 7 | PHASE 8 |
|---|---|---|---|---|---|---|---|---|
| A |  | S1 |  | S3 |  | S5 |  | S7 |
| B | S6 |  | S6 |  | S6 |  | S6 |  |

FIG. 11(G)

|   | PHASE 1 | PHASE 2 | PHASE 3 | PHASE 4 | PHASE 5 | PHASE 6 | PHASE 7 | PHASE 8 |
|---|---|---|---|---|---|---|---|---|
| A |  | S1 |  | S3 |  | S5 |  | S7 |
| B | S8 |  | S8 |  | S8 |  | S8 |  |

FIG. 11(H)

SWITCHING CIRCUITRY

The present invention relates to switching circuitry for use, for example, in high-speed digital-to-analog converters (DACs).

FIG. 1 shows an overview of a previously considered DAC. The DAC in FIG. 1 is part of a DAC integrated circuit (IC) of the current-steering type, and is designed to convert an m-bit digital input word (D1-Dm) into a corresponding analog output signal.

Referring to FIG. 1, the DAC 1 contains analog circuitry including a number n of identical current sources $2_1$ to $2_n$, where $n=2^{m-1}$. Each current source 2 passes a substantially constant current I. The analog circuitry further includes a number n of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter.

Each differential switching circuit 4 receives one of a plurality of digital control signals T1 to Tn (called "thermometer-coded signals" for reasons explained hereinafter) and selects either its first terminal or its second terminal in accordance with the value of the signal concerned. A first output current $I_A$ of the DAC 1 is the sum of the respective currents delivered to the first terminals of the differential switching circuit, and a second output current $I_B$ of the DAC 1 is the sum of the respective currents delivered to the second terminals of the differential switching circuit. The analog output signal is the voltage difference $V_A$-$V_B$ between a voltage $V_A$ produced by sinking the first output current $I_A$ of the DAC 1 into a resistance R and a voltage $V_B$ produced by sinking the second output current $I_B$ of the converter into another resistance R.

The thermometer-coded signals T1 to Tn are derived from the binary input word D1-Dm by digital circuitry including a binary-thermometer decoder 6. The decoder 6 operates as follows. When the binary input word D1-Dm has the lowest value the thermometer-coded signals T1-Tn are such that each of the differential switching circuits $4_1$ to $4_n$ selects its second terminal so that all of the current sources $2_1$ to $2_n$ are connected to the second connection line B. In this state, $V_A=0$ and $V_B=nIR$. The analog output signal $V_A-V_B=-nIR$. As the binary input word D1-Dm increases progressively in value, the thermometer-coded signals T1 to Tn produced by the decoder 6 are such that more of the differential switching circuits select their respective first terminals (starting from the differential switching circuit $4_1$) without any differential switching circuit that has already selected its first terminal switching back to its second terminal. When the binary input word D1-Dm has the value i, the first i differential switching circuits $4_1$ to $4_i$ select their respective first terminals, whereas the remaining n-i differential switching circuits $4_{i+1}$ to $4_n$ select their respective second terminals. The analog output signal $V_A-V_B$ is equal to (2i-n)IR.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

An exemplary differential switching circuit suitable for use with the DAC of FIG. 1 is shown in FIG. 2. This differential switching circuit comprises first and second PMOS field-effect transistors (FETs) S1 and S2. The respective sources of the transistors S1 and S2 are connected to a common node TAIL to which a corresponding current source ($2_1$ to $2_n$ in FIG. 1) is connected. The respective drains of the transistors S1 and S2 are connected to respective first and second output nodes OUTA and OUTB of the circuit which correspond respectively to the first and second terminals of each of the differential switching circuits shown in FIG. 1.

Each transistor S1 and S2 has a corresponding driver circuit $8_1$ or $8_2$ connected to its gate. Complementary input signals IN and INB are applied respectively to the inputs of the driver circuits $8_1$ and $8_2$. Each driver circuit buffers and inverts its received input signal IN or INB to produce a switching signal SW1 or SW2 for its associated transistor S1 or S2 such that, in the steady-state condition, one of the transistors S1 and S2 is on and the other is off. For example, as indicated in FIG. 2, when the input signal IN has the high level (H) and the input signal INB has the low level (L), the switching signal SW1 (gate drive voltage) for the transistor S1 is at the low level L, causing that transistor to be ON, whereas the switching signal SW2 (gate drive voltage) for the transistor S2 is at the high level H, causing that transistor to be OFF. Thus, in this condition, all of the input current flowing into the common node TAIL is passed to the output node OUTA and no current passes to the output node OUTB.

When it is desired to change the state of the circuit of FIG. 2 so that the transistor S1 is OFF and the transistor S2 is ON, complementary changes are made simultaneously in the input signals IN and INB such that the input signal IN changes from H to L at the same time as the input signal INB changes from L to H. As a result of these complementary changes the transistor S1 turns OFF and the transistor S2 turns ON, so that all of the input current flowing into the common node TAIL is passed to the output node OUTB and no current passes to the output node OUTA.

In a differential switching circuit of a high-speed DAC the transistors S1 and S2 are required to switch from OFF to ON and vice versa very quickly. To achieve rapid switching, it is necessary for the transistors to be made as small as possible. However, although making the transistors as small as possible minimises their switching delays, it is found that the mismatch in switching delay from one transistor to another increases.

According to an embodiment of a first aspect of the present invention, there is provided a digital-to-analog converter, comprising: a first field-effect transistor (FET); a second field-effect transistor (FET); and adjusting means for adjusting a bulk voltage (or a gate voltage) applied to at least one of the first and second field-effect transistors (FETs) so as to tend to equalise respective switching delays of the transistors.

It has been recognised that mismatch in switching delay is caused by random variations in the threshold voltages $V_{TH}$ of the transistors. Mismatch in switching delay can also arise from other variations between the transistors, including the gains β of the transistors. Accordingly, it is advantageous to adjust a bulk voltage or a gate voltage applied to one or both of the transistors to compensate for these causes of switching delay.

Such transistors could be configured to switch state at the same time, or the switching times of the transistors could be skewed (delayed) relative to one another. Such transistors could be configured so that one turns from off to on when the other turns from on to off, or so that both turn on or off at the same, or at substantially the same, time.

Although the invention is presented herein with respect to FETs, it will be appreciated that the general inventive concept could be applied to other devices, for example bipolar devices or other switchable devices. However in that case it will be appreciated that a property other than the gate or bulk voltage may need to be adjusted to tend to equalise respective switching delays.

It will be appreciated that the present invention could relate to differential digital-to-analog (digital-to-analogue) converters, or to non-differential circuits such as high-speed single-ended current switches (e.g. in a high-speed laser driver).

The adjusting means may comprise measuring means operable to measure a predetermined property of each of the first and second field-effect transistors, the adjusting means being operable to adjust the bulk (or gate) voltage applied to at least one of the first and second field-effect transistors so as to tend to equalise the measured property for both field-effect transistors.

Preferably, the measuring means are operable to substantially equalise respective input conditions of the first and second field-effect transistors when measurements of the predetermined property are taken. This may enable a fair comparison of the two transistors to be carried.

The measuring means may be operable to compare the measured property of the first field-effect transistor with a reference value for the property and to adjust the bulk (or gate) voltage applied to the first field-effect transistor so as to tend to make the measured property of the first field-effect transistor equal to the reference value, and may be further operable to compare the measured property of the second field-effect transistor with said reference value and to adjust the bulk (or gate) voltage applied to the second field-effect transistor so as to tend to make the measured property of the second field-effect transistor equal to the reference value.

The first field-effect transistor may be connected between a first node and a common node and the second field-effect transistor may be connected between a second node and the common node. In that case, the digital-to-analog converter may be considered to be a differential-type digital-to-analog converter. Similarly, the digital-to-analog converter may have a plurality of such first field-effect transistors, each connected between a first node and a common node, and also having a plurality of such second field-effect transistors, each connected between a second node and said common node, the adjusting means preferably being operable to adjust a bulk (or gate) voltage applied to all, or all but one, of the first and second field-effect transistors so as to tend to equalise respective switching delays of the first and second field-effect transistors.

The adjusting means may comprise measuring means operable to measure a predetermined property of each of the first and second field-effect transistors, the adjusting means being operable to adjust the bulk (or gate) voltages applied respectively to the field-effect transistors so as to tend to equalise the measured property for those field-effect transistors.

Preferably, the measuring means are operable to compare the measured property of each field-effect transistor with a reference value for the property and to adjust the bulk (or gate) voltage applied to the field-effect transistor concerned so as to tend to make the measured property of that field-effect transistor equal to the reference value.

The adjusting means may comprise measuring means operable, for a target one of the first and second field-effect transistors, to select a plurality of different pairs of field-effect transistors, each different pair including the target field-effect transistor, and to measure a predetermined property of the circuitry for each said different pair, the adjusting means preferably being operable to adjust the bulk (or gate) voltage applied to at least the target field-effect transistor in dependence upon the measurement results.

The measuring means may comprise comparing means for comparing the measured property of the circuitry for each said different pair with a reference value, the adjusting means preferably being operable to adjust the bulk (or gate) voltage applied to said target field-effect transistor in dependence upon the comparison results.

The adjusting means may be operable to adjust the bulk (or gate) voltage applied to the target field-effect transistor in dependence only upon the signs (i.e. whether the results are positive or negative) of the comparison results. The adjusting means may be also operable to adjust the bulk (or gate) voltage applied to one or more field-effect transistors other than the target transistor in dependence upon the measurement results. The adjusting means may be operable to maintain an average value of the bulk (or gate) voltages applied to the pluralities of first and second field-effect transistors approximately the same as the individual values of the bulk (or gate) voltages of those transistors are adjusted.

The reference value may be also adjusted when the bulk (or gate) voltage of said one or more transistors are adjusted. The digital-to-analog converter may further comprise reference generating means comprising at least one reference field-effect transistor and also comprising means for adjusting a bulk voltage applied to the or each said reference field-effect transistor so as to adjust said reference value.

The digital-to-analog converter may further comprise measuring means operable, for a target field-effect transistor among said pluralities of first and second field-effect transistors, to select a group of field-effect transistors including the target field-effect transistor, and to measure a predetermined property of the target field-effect transistor over a series of different measurement phases, the adjusting means preferably being operable to adjust a bulk (or gate) voltage of at least the target transistor of the group in dependence upon the measurement results over said series.

The adjusting means are preferably operable to adjust the bulk (or gate) voltage of the target field-effect transistor in dependence upon an average value of the measurement results over the series of measurement phases.

When the target field-effect transistor is one of the first field-effect transistors, each other field-effect transistor of the group may be one of the second field-effect transistors, and, when the target field-effect transistor is one of the second field-effect transistors, each other field-effect transistor of the group may be one of the first field-effect transistors. The measured property for the target transistor may be scaled upwardly according to the number of other field-effect transistors in the group.

The measuring means are preferably adapted to make input conditions of the field-effect transistors being subjected to measurement substantially the same as input conditions thereof during normal operation of the circuitry. Accordingly, the adjustments made can be better related to normal operation of the circuitry, thus better reducing mismatch during normal operation.

The measuring means may comprise means for isolating one or more terminals of the field-effect transistors from remaining parts of the circuitry when the measurements are being taken.

The predetermined property may be a current flowing through the field-effect transistor. The predetermined property may be a potential of said common node.

The measuring means may comprise first and second measurement elements, and may be operable to carry out a first measurement in which one of the two field-effect transistors being subjected to measurement is connected operatively to the first measurement element and the other one of those two field-effect transistor is connected operatively to the second measurement element, and to carry out a second measurement in which said other field-effect transistor is connected operatively to the first measurement element and said one field-effect transistor is connected operatively to the second measurement element.

The digital-to-analog converter may, for example, comprise a plurality of circuitry segments, each segment comprising at least first and second field-effect transistors, the adjusting means preferably being operable to adjust a bulk (or gate) voltage applied to at least one of the first and second field-effect transistors in each segment so as to tend to equalise respective switching delays of the field-effect transistors in the segment concerned. Preferably, the adjusting means are operable to adjust the bulk voltage in at least one circuitry segment whilst the remaining circuitry segments remain in operation.

According to an embodiment of a second aspect of the present invention, there is provided switching circuitry, operative repetitively in a series of switching phases, the circuitry comprising: at least one first field-effect transistor connected between a common node of the circuitry and a first node of the circuitry; at least one second field-effect transistor connected between said common node and a second node of the circuitry; switch control means connected with said first and second field-effect transistors and operable to cause the same number of field-effect transistors to change state in each said switching phase; and adjusting means for adjusting a bulk voltage or a gate voltage applied to each, or each but one, of the field-effect transistors, so as to tend to equalise respective switching delays of the transistors.

Such switching circuitry is preferably operative in repeating sequences of n phases, where n is an integer greater than 1, and preferably has n first field-effect transistors and n second field-effect transistors.

According to an embodiment of a third aspect of the present invention, there is provided a digital-to-analog converter comprising switching circuitry according to the aforementioned second aspect of the present invention. Optionally, such a digital-to-analog converter may have just one first field-effect transistor and just one second field-effect transistor, the switch control means being operable in a return-to-zero mode in which the number of changes of state of said first and second field-effect transistors is the same in each said switching phase.

According to an embodiment of a fourth aspect of the present invention, there is provided an input circuit comprising: an input node, at which an input signal is received; first and second circuit sections; a first field-effect transistor connected between the input node and said first circuit section; a second field-effect transistor connected between the input node and said second circuit section; control means connected with the first and second field-effect transistors for causing the first field-effect transistor to supply the input signal from the input node to the first circuit section in a first operating phase and for causing the second field-effect transistor to supply the input signal from the input node to the second circuit section in a second operating phase; and adjusting means for adjusting a bulk voltage or a gate voltage applied to one or both of said first and second field-effect transistors so as to tend to equalise respective switching delays of the two transistors.

According to an embodiment of a fifth aspect of the present invention, there is provided an output circuit comprising: an output node, at which an output signal is received; first and second circuit sections; a first field-effect transistor connected between the output node and said first circuit section; a second field-effect transistor connected between the output node and said second circuit section; control means connected with the first and second field-effect transistors for causing the first field-effect transistor to supply the output signal from the first circuit section to the output node in a first operating phase and for causing the second field-effect transistor to supply the output signal from the second circuit section to the output node in a second operating phase; and adjusting means for adjusting a bulk voltage or a gate voltage applied to one or both of said first and second field-effect transistors so as to tend to equalise respective switching delays of the two transistors.

It will be appreciated that the present invention extends to method aspects corresponding respectively to the above five aspects of the present invention. For example, according to an embodiment of a sixth aspect of the present invention, there is provided a method for use in a digital-to-analog converter, the digital-to-analog converter comprising a first field-effect transistor (FET) and a second field-effect transistor (FET), the method comprising adjusting a bulk voltage (or a gate voltage) applied to at least one of the first and second field-effect transistors (FETs) so as to tend to equalise respective switching delays of the transistors. It will be appreciated that features of the aforementioned first to fifth aspects of the present invention apply to method aspects and vice versa.

According to an embodiment of a seventh aspect of the present invention, there is provided an IC chip or chipset comprising a digital-to-analogue converter according to the aforementioned first and third aspects of the present invention, or comprising switching circuitry according to the aforementioned second aspect of the present invention, or comprising an input circuit according to the aforementioned fourth aspect of the present invention, or comprising an output circuit according to the aforementioned fifth aspect of the present invention.

According to an embodiment of an eighth aspect of the present invention, there is provided a circuit board comprising a digital-to-analogue converter according to the aforementioned first and third aspects of the present invention, or comprising switching circuitry according to the aforementioned second aspect of the present invention, or comprising an input circuit according to the aforementioned fourth aspect of the present invention, or comprising an output circuit according to the aforementioned fifth aspect of the present invention.

According to an embodiment of a ninth aspect of the present invention, there is provided an RF transmitter comprising a digital-to-analogue converter according to the aforementioned first and third aspects of the present invention, or comprising switching circuitry according to the aforementioned second aspect of the present invention, or comprising an input circuit according to the aforementioned fourth aspect of the present invention, or comprising an output circuit according to the aforementioned fifth aspect of the present invention, or comprising an IC chip or chipset according to the aforementioned seventh aspect of the present invention, or comprising a circuit board according to the aforementioned eighth aspect of the present invention. Such an RF transmitter may be part of a base station, relay station or a mobile device, and accordingly the present invention extends to this equipment too.

Reference will now be made, by way of example, to the accompanying drawings, in which:

FIG. 1, discussed hereinbefore, shows parts of a previously-considered DAC;

FIG. 2, discussed hereinbefore, shows conventional differential switching circuitry suitable for use in the FIG. 1 DAC;

Figure 10:
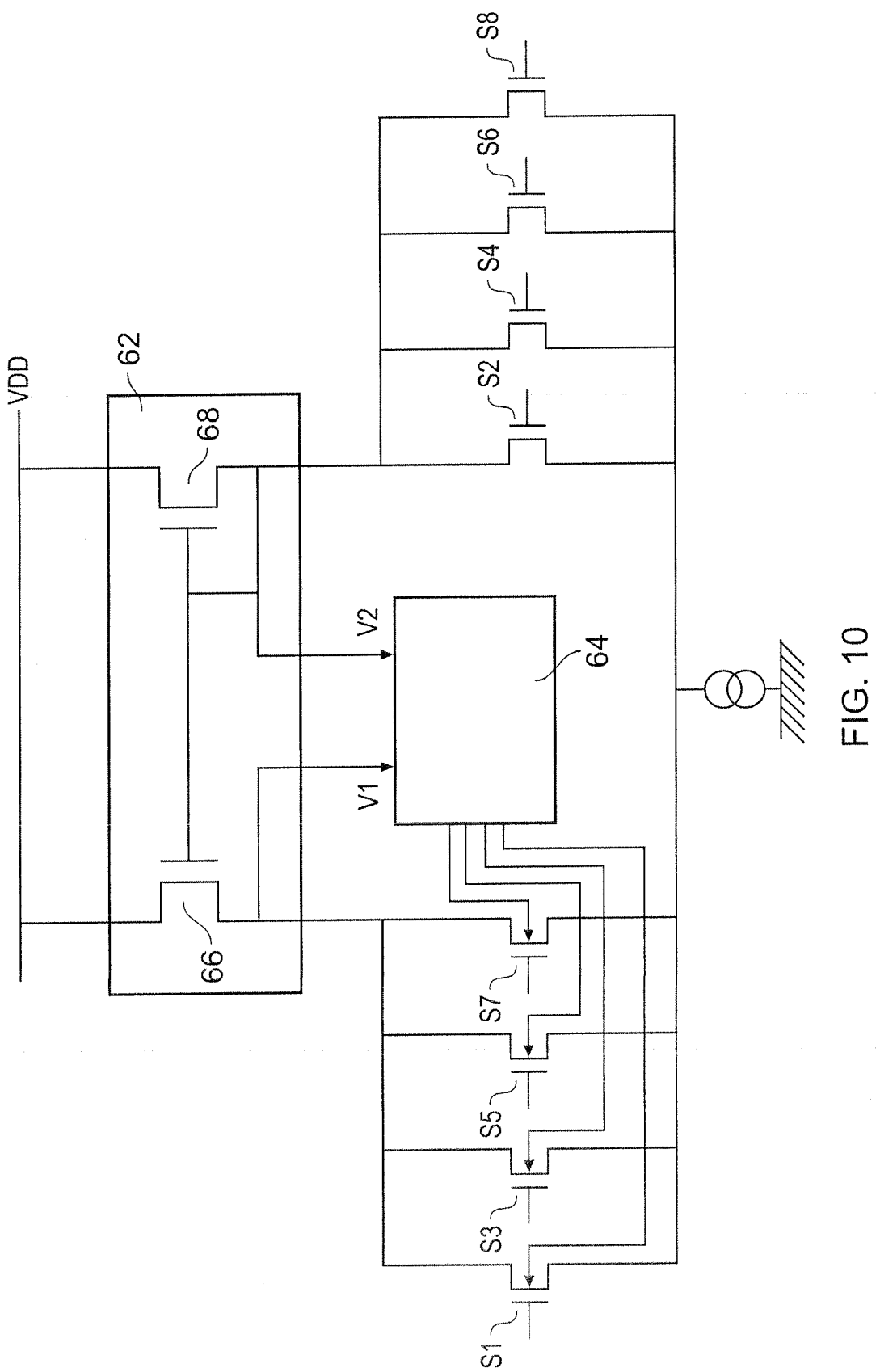
FIG. 10 shows parts of switching circuitry according to a third embodiment of the present invention.
Figure 12:
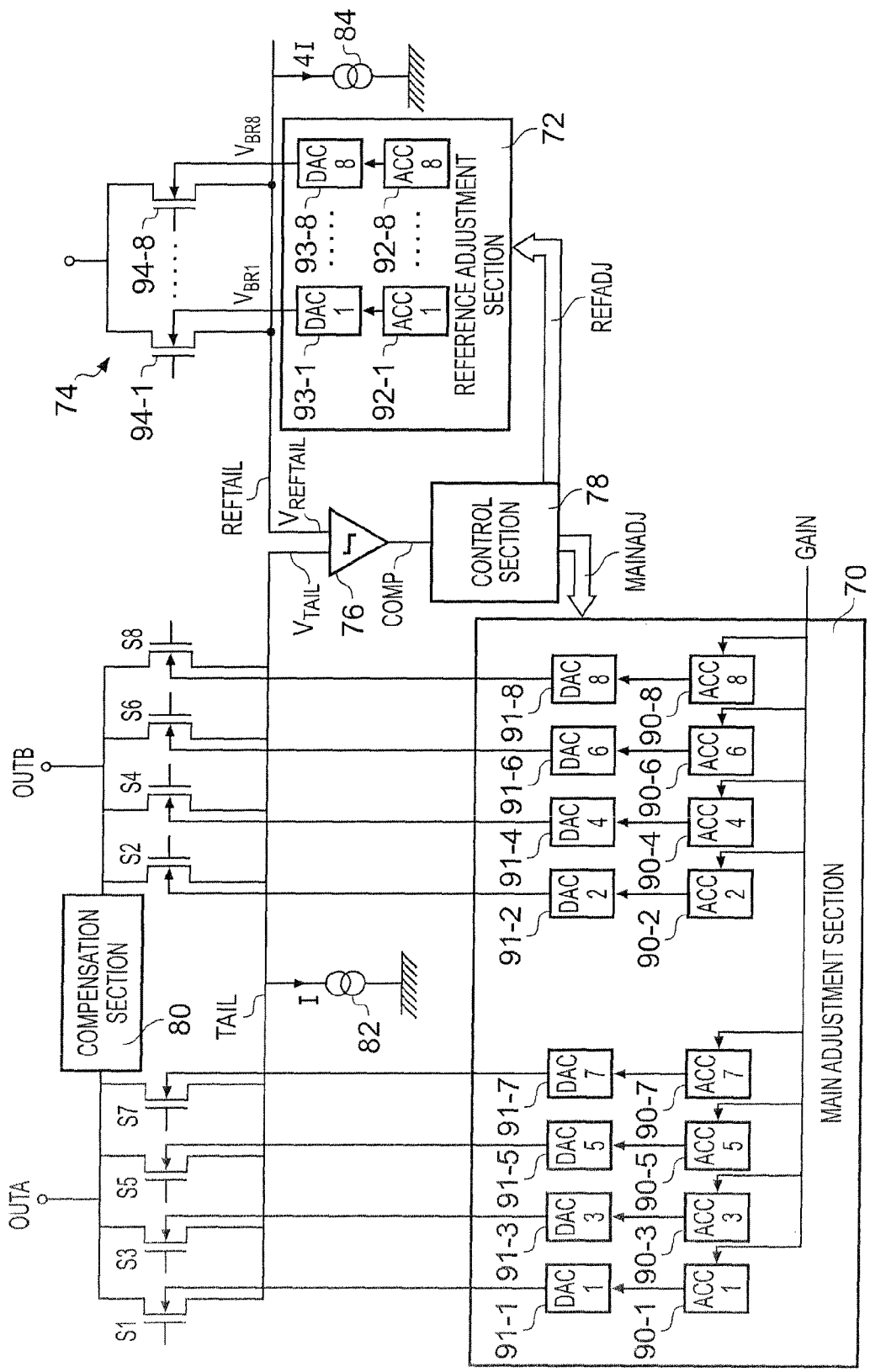
Figure 14:
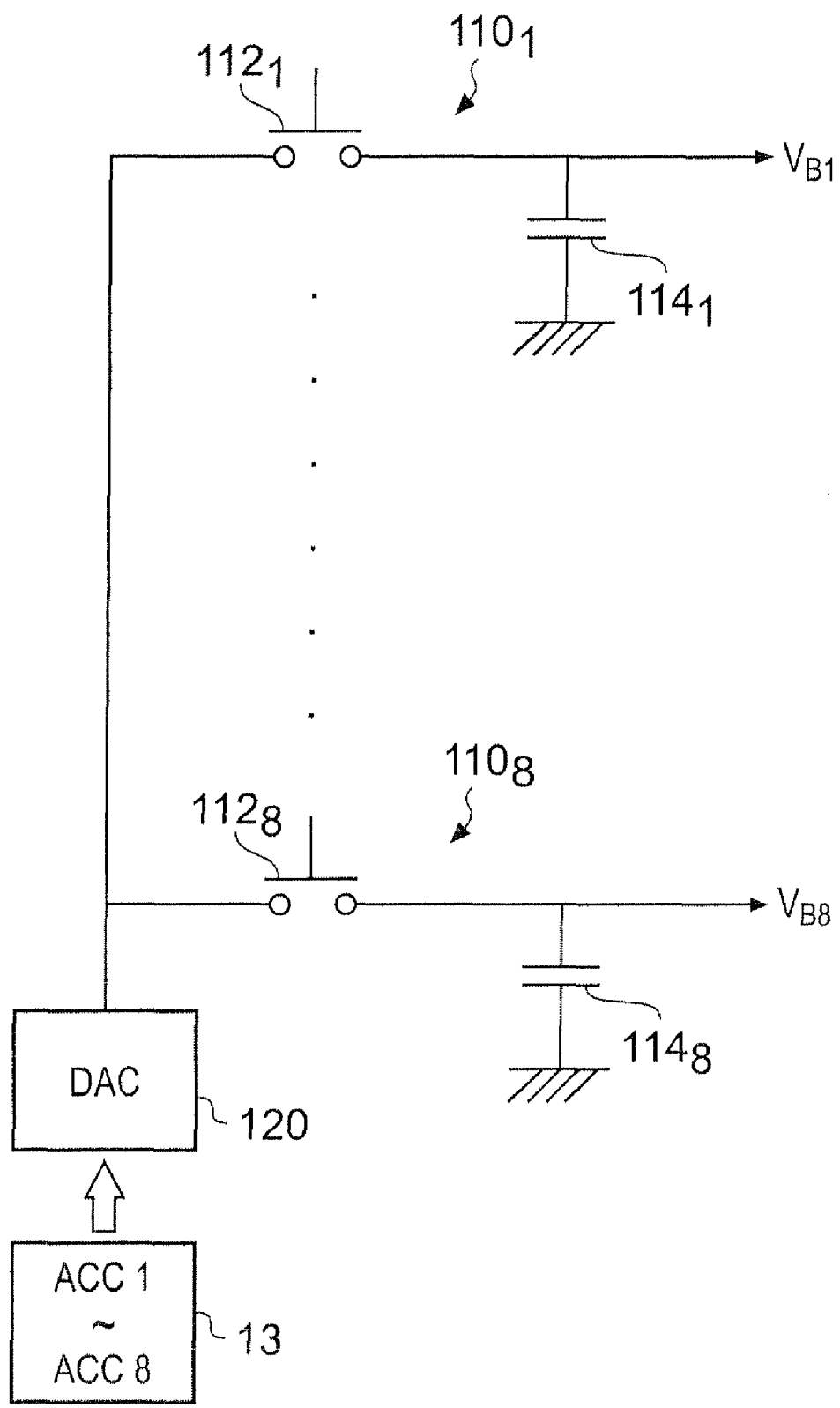
Figure 15:
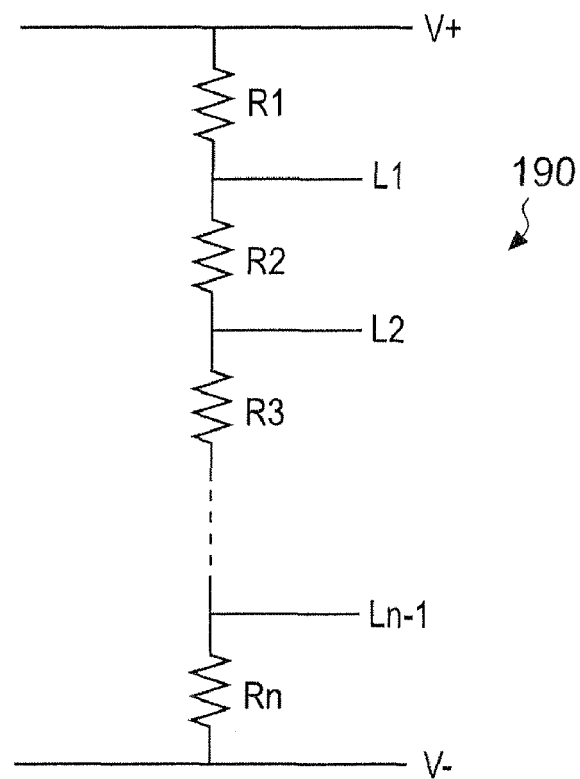
Figure 16:
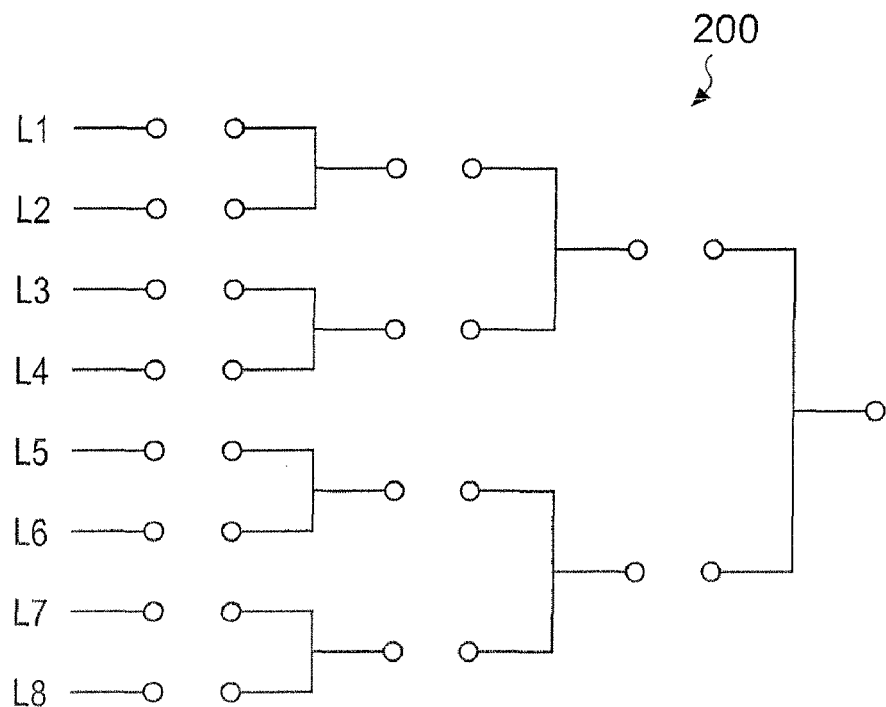
Figure 17:
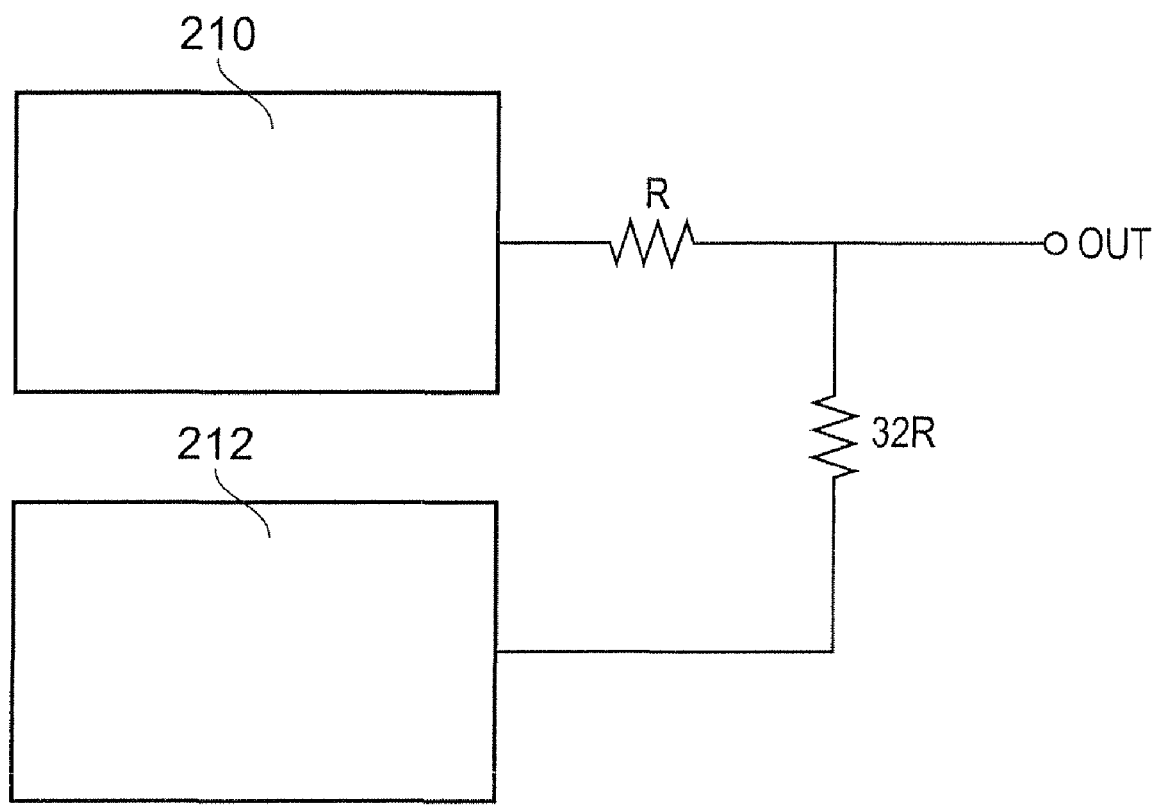
Figure 18:
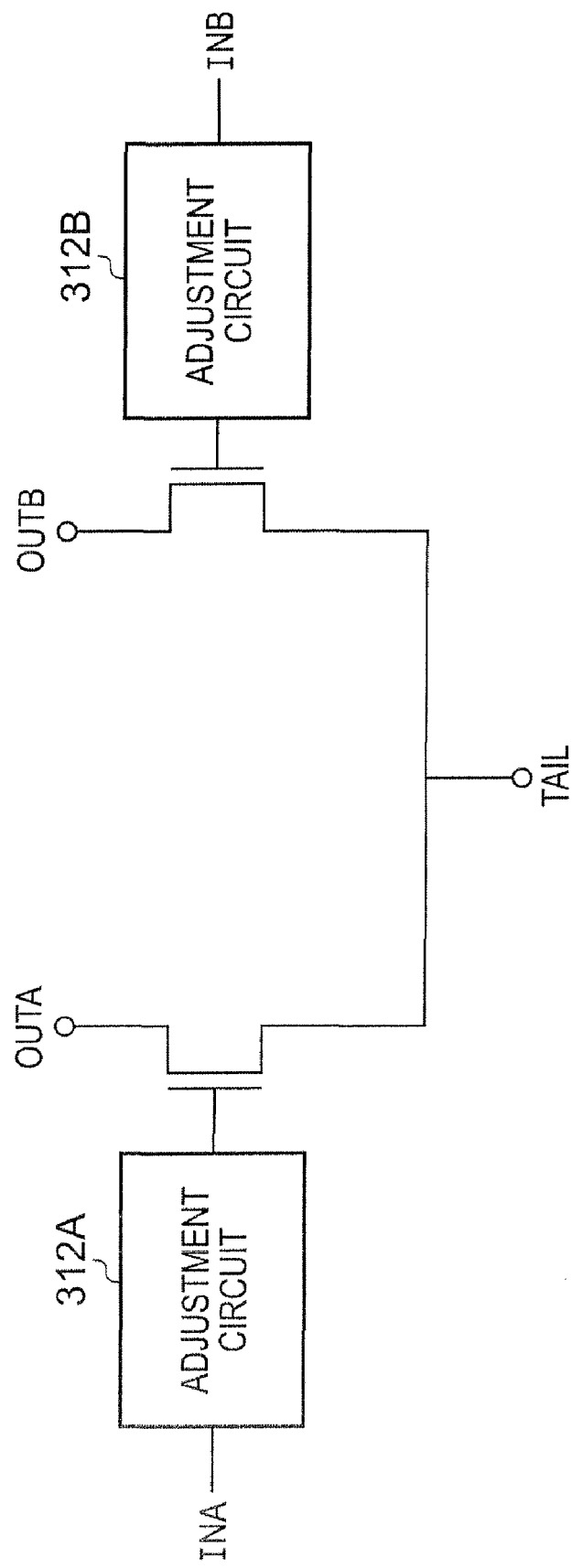

FIGS. 11(A) to 11(H) are tables for use in explaining operation of the FIG. 10 switching circuitry;

FIG. 12 shows parts of switching circuitry according to a fourth embodiment of the present invention;

FIGS. 13(A) to 13(H) are graph presenting simulation results relating to the FIG. 12 switching circuitry;

FIG. 14 shows a modification to the FIG. 12 switching circuitry;

FIG. 15 shows parts of a DAC suitable for use in the FIG. 12 switching circuitry;

FIG. 16 shows further parts of the DAC of FIG. 15;

FIG. 17 shows parts of another DAC suitable for use in the FIG. 12 switching circuitry; and FIG. 18 shows parts of switching circuitry according to a fifth embodiment of the present invention.

Figure 3:
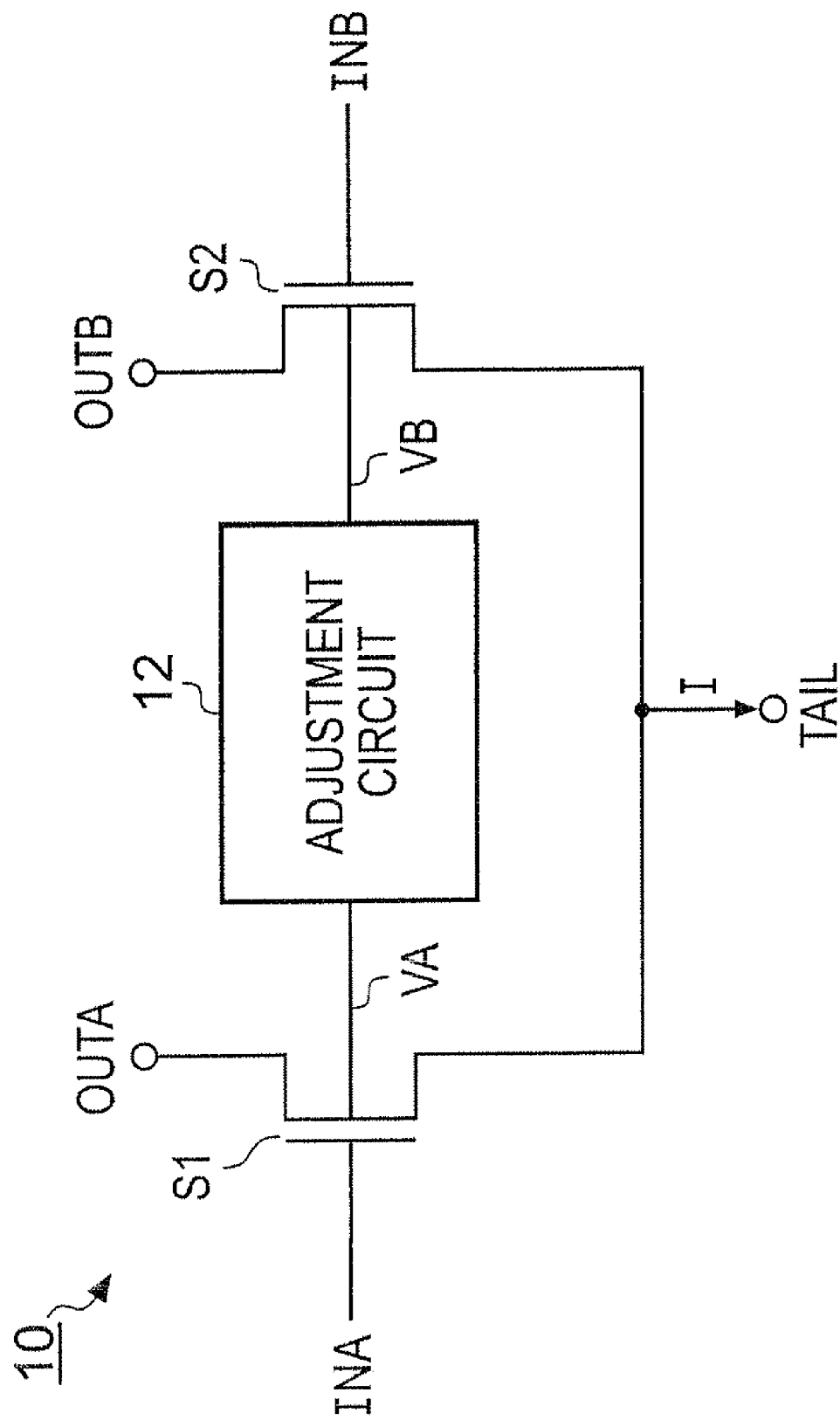
FIG. 3 shows differential switching circuitry embodying the present invention.

FIG. 3 shows schematically differential switching circuitry embodying the present invention. The differential switching circuitry 10 comprises a first field-effect transistor S1 connected between a first node OUTA and a common node TAIL. The circuitry also comprises a second field-effect transistor S2 connected between the common node TAIL and a second node OUTB of the circuitry. The first and second FETs S1 and S2 receive at their respective gates complementary switching signals INA and INB. These complementary switching signals are controlled so that one of the transistors S1 and S2 is ON when the other transistor is OFF and so that, insofar as is possible, one transistor turns off at the same time as the other transistor turns on.

The first and second FETs S1 and S2 are n-type FETs in this example, and a current sink (not shown) is connected between the common node TAIL and a ground supply line GND of the circuitry. This current sink causes a substantially constant current I to flow through the common node TAIL at all times. Of course, p-type FETs can be used instead, in which case a current source is connected between a positive supply line VDD of the circuitry and the common node TAIL. In the embodiments described later, the FETs S1 and S2 are n-type devices unless otherwise stated.

The differential switching circuitry 10 may be required to operate at very high speeds. For example, it is contemplated that the circuitry might be used in a high-speed DAC capable of operation at 12 Gsamples/s. At such high conversion rates, the switching delays of the transistors S1 and S2, and in particular mismatches between respective switching delays of different transistors, become significant. In particular, as the transistors are made smaller, enabling them to switch faster, random mismatches between the threshold voltages of different transistors can cause significant mismatch between their respective switching delays. Such mismatches in switching delays in turn cause distortion of the DAC output.

The differential switching circuitry 10 of FIG. 3 comprises an adjustment circuit 12 connected to the first FET S1 and to the second FET S2. The adjustment circuit 12 applies an adjustable bulk voltage VA to the first FET S1. The adjustment circuit 12 also applies an adjustable bulk voltage VB to the second FET S2. The bulk voltages VA and VB can be different from one another.

In practice, each of the FETs is formed in its own well in the semiconductor substrate. For example, if the FETs are of the n-type conductivity, then each of them is formed in its own well of p-type conductivity (p-well). Each such well is biased to a suitable potential (bulk voltage), as is well known in the art. Thus, in the FIG. 3 circuitry, the adjustment circuit 12 applies the adjustable bulk voltage VA to the well in which the first FET S1 is formed, and applies the adjustable bulk voltage VB to the well in which the second FET S2 is formed. The effect of changing the bulk voltages of the two FETs is to change the gate-source voltage at which the transistor changes state. In this way, it is possible to compensate for the effects of random threshold voltage variations on the switching point.

Figure 4:
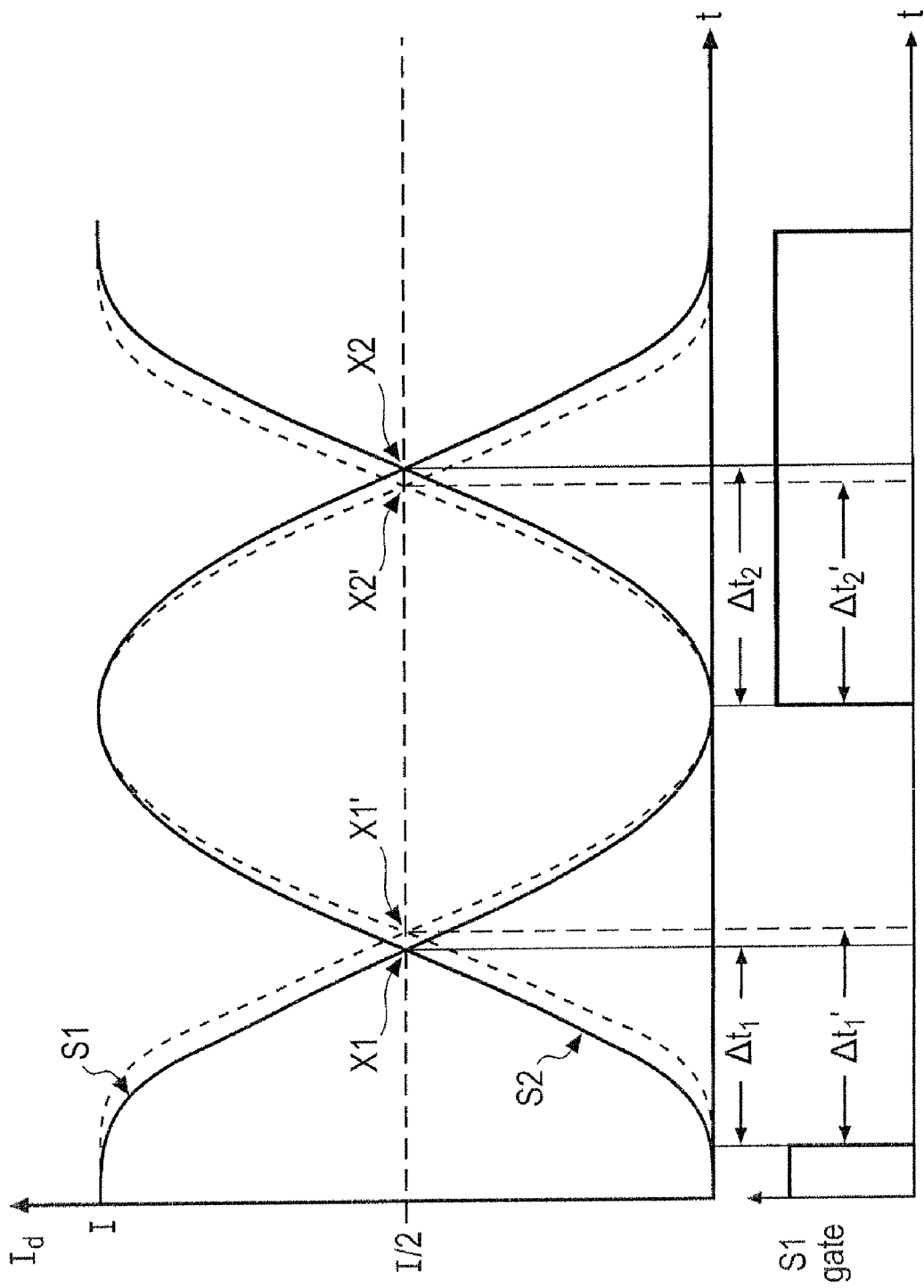
FIG. 4 shows switching waveforms generated in the FIG. 3 circuitry.

FIG. 4 shows an example of the switching waveforms during a switching operation of the differential switching circuitry of FIG. 3. The graph shows the variation of drain current of each of the transistors S1 and S2 with time. It is assumed in this example that at a first switching event the transistor S1 is initially on and is being turned off and the transistor S2 is initially off and is being turned on. Ideally, the switching waveforms of the two transistors are perfectly symmetrical and the switching point (at which the respective drain currents of the two transistors become equal and I/2) is the point X1 shown in FIG. 4. However, if the threshold voltage $V_{TH}$ for transistor S1 is smaller than that of the transistor S2, then the actual switching point X1' is delayed relative to the ideal switching point X1. At a second switching event, S1 is initially off and is being turned on, and S2 is initially on and being turned off. In this case, the actual switching point X2' is advanced relative to the ideal switching point X2.

In FIG. 3, it is unnecessary for the adjustment circuit 12 to adjust the bulk voltages of both the transistors S1 and S2. For example, it would be sufficient to be able to adjust the bulk voltage of one of the two transistors S1 and S2, as the only goal is to equalise the switching delays of the two transistors S1 and S2 and this can be done simply by adjusting the bulk voltage of one of the transistors, the bulk voltage of the other transistor remaining constant.

In order to be able to adjust one or both bulk voltages so as to tend to equalise the switching delays, it is necessary to compare a suitable property of the two transistors. Ideally, the property compared would be the switching delay directly. However, it is not readily possible in practice to measure the switching delay of each transistor directly. Accordingly, in embodiments of the present invention, other predetermined properties of the FETs, which are indirect measures of the switching delay, are used to carry out the bulk voltage adjustment.

A first such predetermined property which can be used is the drain current of each transistor S1 and S2.

A first possibility is to substantially equalise the same "inputs" to the two transistors S1 and S2 and then adjust VA and/or VB until the drain currents flowing through the two transistors are the same. Here, the same inputs means that, so far as is practicable, the drain potentials of the two transistors are the same, the gate potentials of the two transistors are the same, and the source potentials of the two transistors are the same. Under these conditions, it can be assumed, to a reasonable approximation, that any differences between the drain currents of the two transistors are the result of threshold voltage variations between the two transistors. Accordingly, by adjusting one or both of VA and VB to equalise the drain currents, it is possible to compensate for such threshold voltage variations.

A second possibility is to provide a reference (or "golden") transistor, generally similar to the transistors S1 and S2, and adjust each of the transistors S1 and S2 in turn so that its drain current is equal to the drain current of the reference transistor. The bulk voltage applied to the reference transistor is kept constant. In other words, to calibrate the first transistor S1, the bulk voltage VA is adjusted until the drain current of the first transistor S1 is equal to the drain current of the reference transistor. Separately, the bulk voltage VB of the second transistor S2 is adjusted so that the drain current of the second transistor S2 becomes equal to the drain current of the reference transistor.

Figure 5:
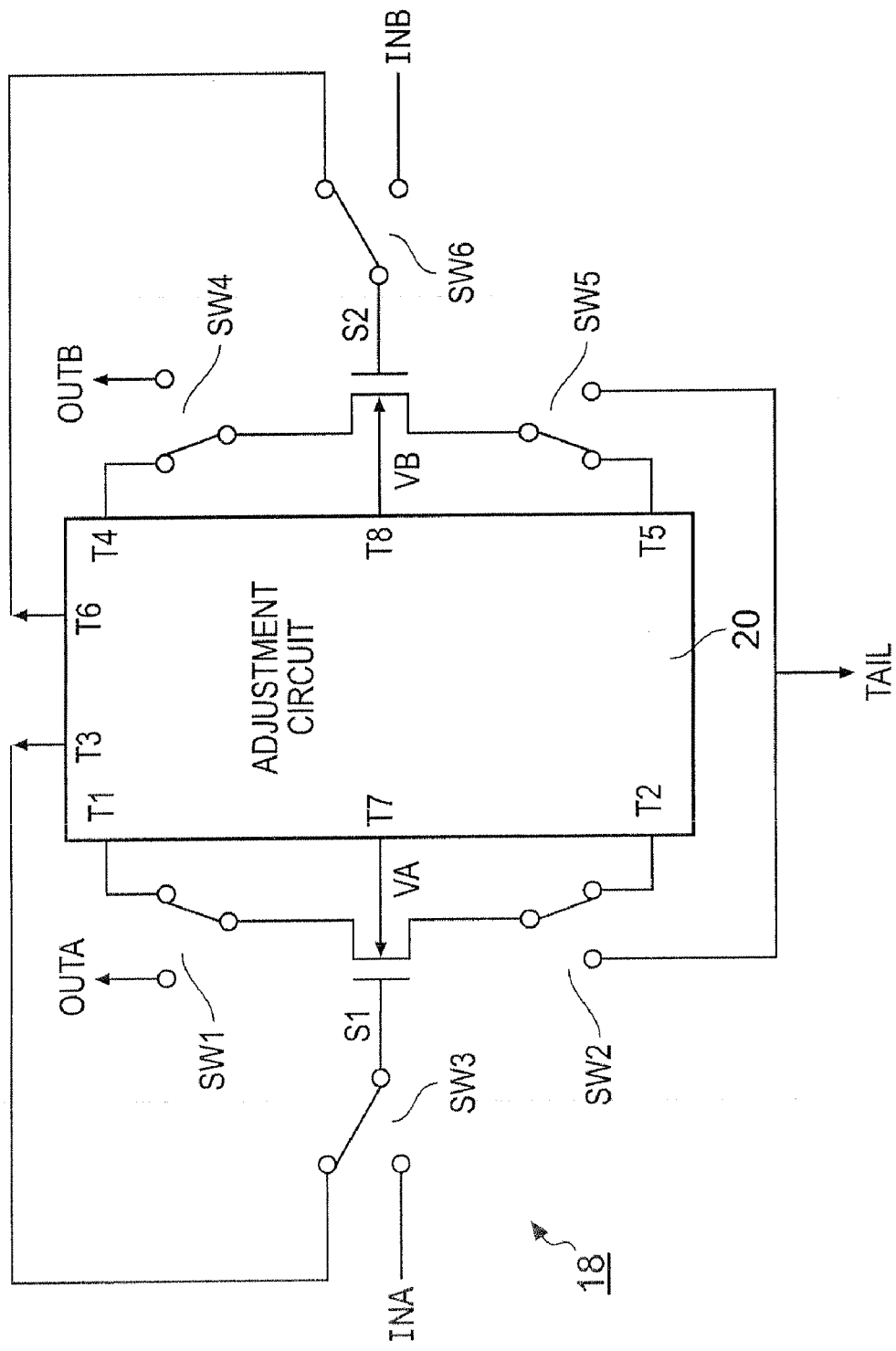
FIG. 5 shows parts of switching circuitry embodying the present invention.

FIG. 5 shows differential switching circuitry 18 according to a first embodiment of the present invention. The circuitry 18 comprises an adjustment circuit 20, first and second FETs S1 and S2 as described previously, and first to sixth selection switches SW1 to SW6. In FIG. 5, these selection switches are shown in the positions they have in a "calibration" mode of the circuitry. In this calibration mode, the first and second FETs S1 and S2 are isolated from the common node TAIL and the first and second output nodes OUTA and OUTB. Instead, the drain of the first FET S1 is connected to a terminal T1 of the adjustment circuit 20, the source of S1 is connected to a terminal T2 of the adjustment circuit, and the gate of S1 is connected to a third terminal T3 of the adjustment circuit. Similarly, the drain, source and gate of the second FET S2 are connected respectively to fourth, fifth and sixth terminals T4, T5 and T6 of the adjustment circuit 20.

In a normal operating mode of the circuitry 18, the selection switches SW1 to SW6 are changed over to their other positions so that the first and second FETs are connected in the manner shown in FIG. 3.

Figure 6:
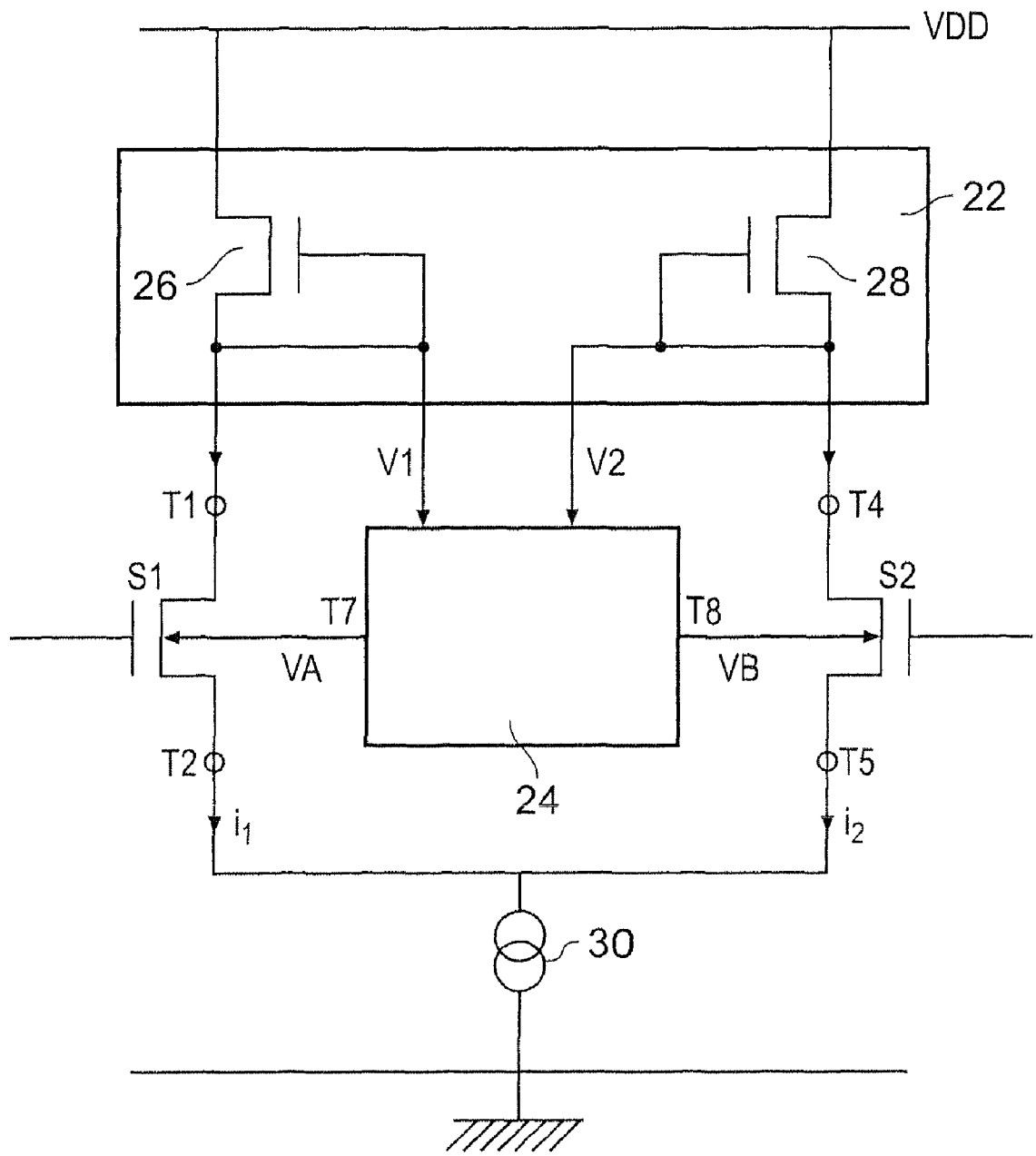
FIG. 6 shows parts of switching circuitry according to a first embodiment of the present invention.

FIG. 6 shows a first example implementation of the FIG. 5 adjustment circuit 20. This first example corresponds to the first possibility mentioned above, namely adjusting the bulk voltages VA and VB until the drain currents of the first and second FETs S1 and S2 are equal.

In FIG. 6, the selection switches are omitted for the sake of clarity but it is assumed that these switches are in the positions shown in FIG. 5, i.e. the circuitry is in the calibration mode.

As shown in FIG. 6, the adjustment circuit 20 in this example comprises a measurement section 22 and an adjustment section 24. The measurement section 22 comprises first and second p-type FETs 26 and 28. The gate and drain of the transistor 26 are connected together, the gate and drain of the transistor 28 are connected together, and the sources of the transistors 26 and 28 are connected together to a power supply line VDD. A first output V1 of the measurement section is taken from the drain of the transistor 26, and a second output of the measurement section is taken from the drain of the transistor 28.

The drain of the transistor S1 is connected to the drain of the transistor 26. Similarly, the drain of the transistor S2 is connected to the drain of the transistor 28. The respective sources of the transistors S1 and S2 are connected together to a current sink 30.

In use of the adjustment circuit of FIG. 6, the transistors S1 and S2 are both turned on during a measurement. A current $i_1$ flows through the transistor S1 and the transistor 26, and a current $i_2$ flows through the transistor S2 and the transistor 28. The sum of the currents $i_1$ and $i_2$ is fixed and is equal to the current sunk by a current sink 30.

The transistors 26 and 28 are identical to one another, so that the gate-source voltages thereof are the same when the currents $i_1$ and $i_2$ flowing through the transistors are the same.

Initially, the currents $i_1$ and $i_2$ will not be the same, for example due to variations in the threshold voltages of the transistors S1 and S2. In this case, the voltages V1 and V2 produced by the measurement section 22 will also be different from one another. The adjustment section 24 receives the voltages V1 and V2 and adjusts one or both of the bulk voltages VA and VB in such a way as to tend to equalise V1 and V2.

During the adjustment process, the gate potentials of the transistors S1 and S2 are made the same by applying the same fixed voltage thereto. Similarly, the source potentials of the transistors S1 and S2 are the same because they are connected together. The drain potentials of the transistors S1 and S2, i.e. the voltages V1 and V2, are of course not the same at the start of the adjustment process. However, as the difference between V1 and V2 is reduced, following the adjustments to the bulk voltages VA and/or VB, the potentials V1 and V2 become equalised and, at this time, all of the "inputs" to the transistors S1 and S2 are the same.

Incidentally, the transistors 26 and 28 in the measurement section 22 may also have threshold voltage mismatches between one another. However, the mismatch in threshold voltage between the transistors 26 and 28 is much lower than the mismatch between the threshold voltages of the FETs S1 and S2 because the transistors 26 and 26 do not need to be designed to switch quickly. For example, the transistors 26 and 28 can be made much larger than the transistors S1 and S2 (perhaps 10 or more times wider and longer). This in turn means that the threshold voltage variation between the transistors 26 and 28 is much smaller than that between the transistors S1 and S2.

It is of course possible to replace the transistors 26 and 28 in the measurement section by resistors of equal values.

One practical problem with a measurement section using resistors is how to achieve good matching between the resistors. This problem can be solved by taking two measurements, the first with the transistor S1 connected to a first one of the resistors and the transistor S2 connected to a second one of the resistors, and the second with the transistors S1 and S2 connected to the second and first resistors, respectively. The measurement results are then averaged to overcome errors due to mismatch between the two resistors. The averaging will also eliminate any other errors such as offset errors in the measurement section.

This swapping-over technique can be applied when the measurement section uses transistors (such as the transistors 26 and 28 in FIG. 6), too, so as to eliminate the effects of mismatches between the measurement transistors.

In the FIG. 6 circuit, it is preferable that the currents $i_1$ and $i_2$ used for calibration of VA and VB are the same as the currents which will be flowing through the transistors S1 and S2 at the switching point of the differential switching circuitry. Assuming that the current which flows through each transistor when in the steady on state is I, it follows that $i_1=i_2$ should be made substantially equal to I/2. To achieve this, all that is required is for the current sunk by the current sink 30 to be I. This of course is the same current required to be sunk when the circuitry 18 is in the normal operating mode. Accordingly, it may be possible to dispense with the selection switches SW2 and SW5 in FIG. 5 and simply leave the respective sources of the transistors S1 and S2 connected permanently to the common node TAIL.

It is not essential to carry out the adjustment to reach the state in which $i_1$ and $i_2$ are equal to I/2. For example, the adjustment could be carried out to make the two currents $i_1$ and $i_2$ equal to one another but to have some other value. In that case, the current sink 30 used in the calibration mode will need to sink a different current from the current that is sunk from the common node TAIL in the normal operating mode.

If different currents are used for the measurements from the currents in actual operation, the effects on the switching delays of threshold voltage variations among the transistors should still be compensated, as a $V_{TH}$ error is independent of current. However, other variations that affect the switching delay, notably β errors, are current-dependent, so to compensate for such errors (as well as $V_{TH}$ errors) it is preferable to take the measurements at the currents which will be used in operation.

In the FIG. 6 implementation, the adjustment circuit 20 measures the currents flowing through the two transistors S1 and S2 of the differential switching circuitry 18 at the same time, and adjusts the bulk voltage of one or both of the transistors based on the measurement results.

Figure 7:
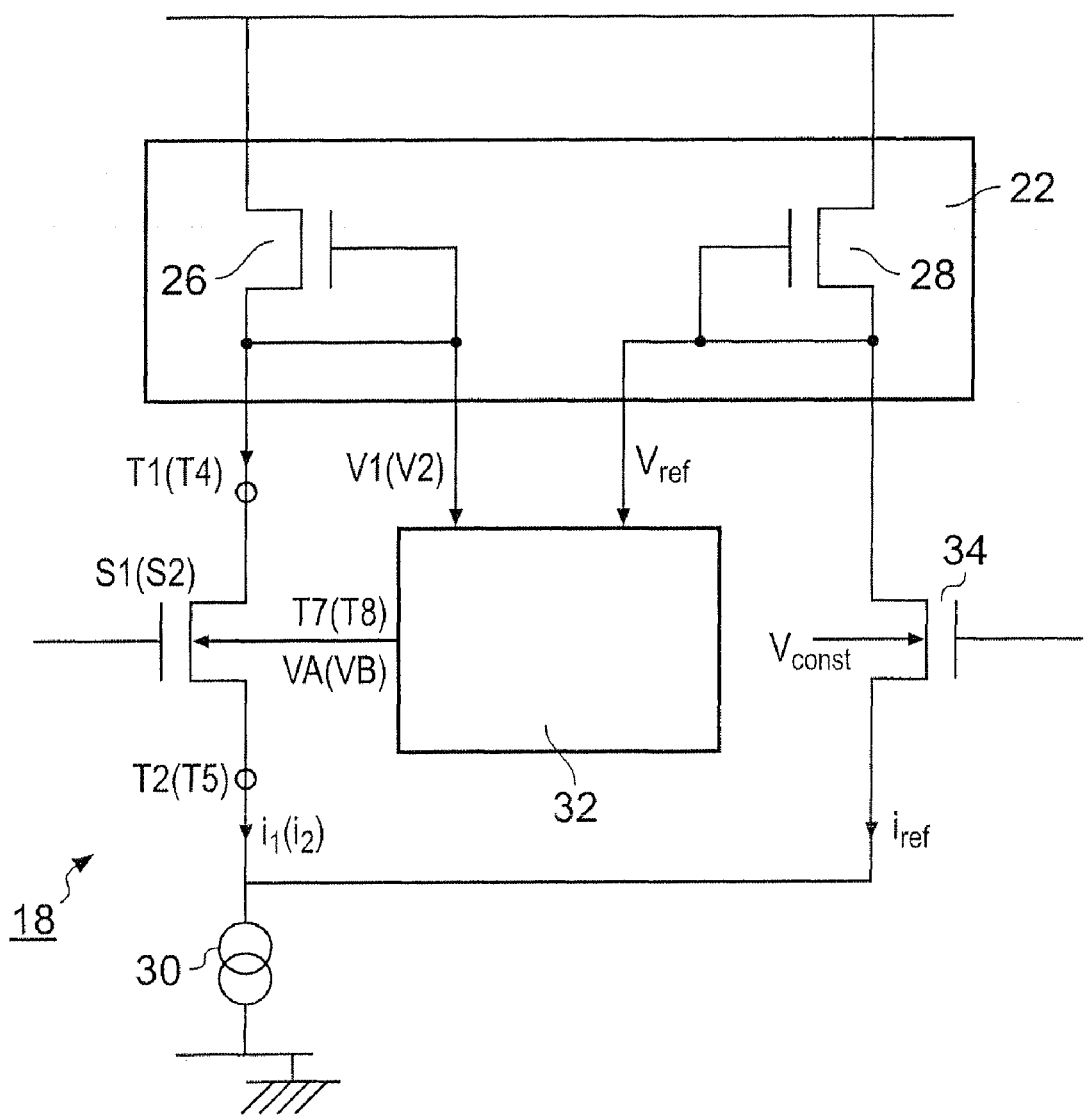
FIG. 7 shows parts of switching circuitry according to a variation of the first embodiment of the present invention.

FIG. 7 shows a second example implementation in which each of the transistors S1 and S2 is compared individually with a reference transistor and its bulk voltage is then adjusted in dependence on the comparison results.

In FIG. 7, the adjustment circuit (20 in FIG. 5) comprises a measurement section 22 and an adjustment section 32. The adjustment circuit further comprises a reference transistor 34. When the circuitry is in the calibration mode, this reference transistor 34 has its source connected to the source of the transistor S1 or S2 being calibrated. The drain of the transistor 34 is connected to the drain of the transistor 28 in the measurement section 22. Accordingly, in this case, the transistor 28 has the same current flowing through it as the reference transistor 34, i.e. a reference current $i_{ref}$. The potential of the drain of the transistor 28 is supplied as a reference signal $V_{REF}$ to the adjustment section 32.

The reference transistor 34 has a fixed bulk voltage $V_{const}$ applied to it.

Operation of the FIG. 7 circuit will now be described. The calibration mode in the FIG. 7 circuitry has two different phases. In a first phase, the transistor S1 is calibrated against the reference transistor 34 and in a second phase the transistor S2 is calibrated against the reference transistor 34.

In the first phase, the transistor S2 is isolated from the remaining parts of the differential switching circuitry. This can be done, for example, by setting the switches SW4 to SW6 in FIG. 5 to an open-circuit condition. The transistor S1 is then connected to the adjustment circuit 20 as shown in FIG. 5, i.e. the drain is connected to the terminal T1, the source is connected to the terminal T2 and the gate is connected to the terminal T3.

Under this condition, the transistors S1 and 34 are both turned on. The measurement section 22 produces a signal V1 representing the current $i_1$ flowing through the transistor S1 and also produces the reference signal $V_{ref}$ representing the current $i_{ref}$ flowing through the reference transistor 34. The sum I of $i_1$ and $i_{ref}$ is fixed by the current sink 30. The adjustment section 32 receives these signals V1 and $V_{ref}$ and adjusts the bulk voltage VA applied to the transistor S1 so as to tend to equalise V1 and $V_{ref}$. When V1=$V_{ref}$ it follows that $i_1$=$i_{ref}$=I/2.

In the second phase of the calibration mode, the transistor S1 is isolated from the remaining parts of the differential switching circuitry 18, for example by setting the switches SW1 to SW3 in FIG. 5 to an open-circuit condition. Then, the transistor S2 is connected to the adjustment circuit by setting the switches SW4 to SW6 to the positions shown in FIG. 5. Thus, the drain of the transistor S2 is connected to the terminal T4, the source of the transistor S2 is connected to the terminal T5 and the gate of the transistor S2 is connected to the terminal T6.

Under this condition, the transistors S2 and 34 are both turned on. The sum of $i_1$ and $i_{ref}$ is still 1. The measurement section 22 produces a signal V2 representing the current $i_2$ flowing through the transistor S2. This signal V2 and the reference signal $V_{ref}$ are applied to the adjustment section 32 which adjusts the bulk voltage VB applied to the transistor S2 so as to tend to equalise V2 and $V_{ref}$. When V2=$V_{ref}$ it follows that $i_2$=$i_{ref}$=I/2.

As in the FIG. 6 example described previously, it is preferable for $i_1$ and $i_2$ in the calibration mode to be the same currents that flow through the transistors S1 and S2 at the switching point in the normal operating mode. Accordingly, preferably $i_{ref}$=I/2. This can conveniently be achieved by using the same current sink 30 in the calibration mode as is used in the normal operation mode. This makes it possible to omit the selection switches SW2 and SW5 in FIG. 5 and instead permanently connect the respective sources of the S1 and S2 to the common node TAIL. During calibration of one of the two transistors S1 and S2 it is possible to leave the other transistor connected to the common node TAIL because that transistor can be turned off, for example by applying a suitable potential to its gate from the relevant terminal T3 or T6 of the adjustment circuit 20.

Figure 1:
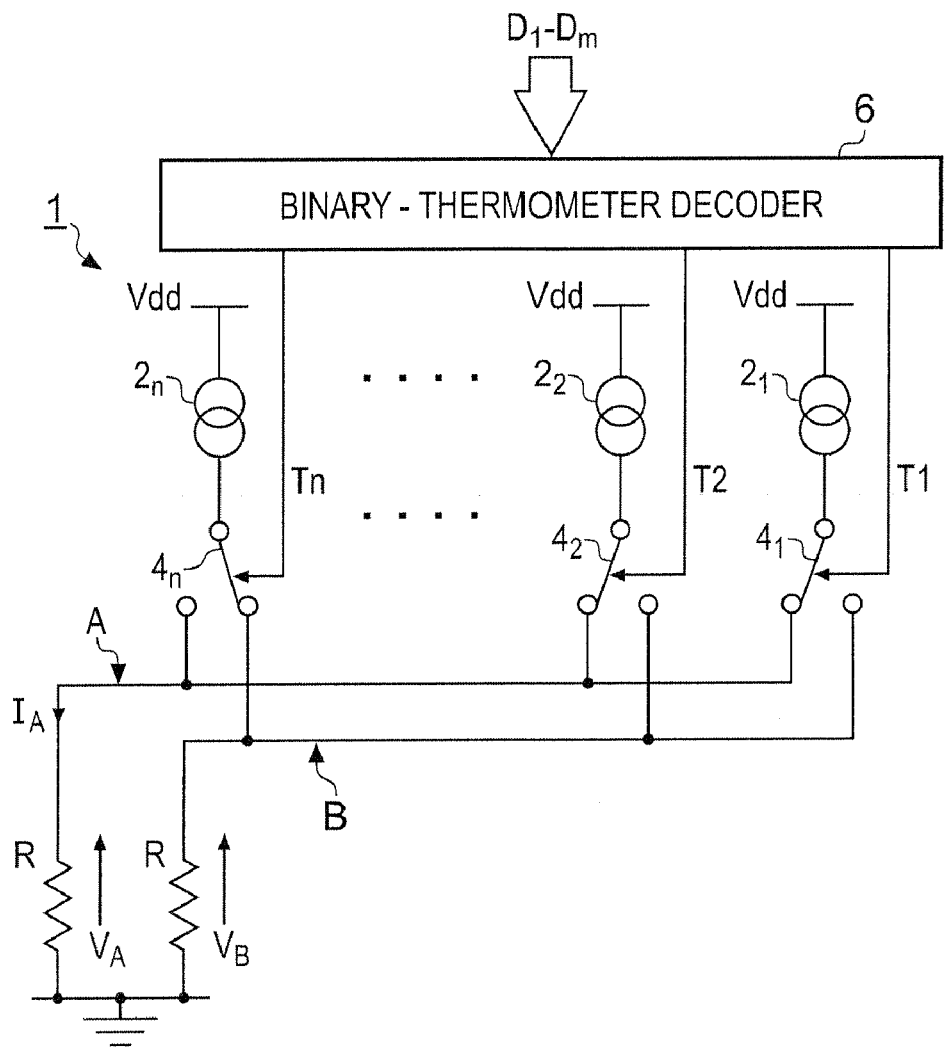
Figure 2:
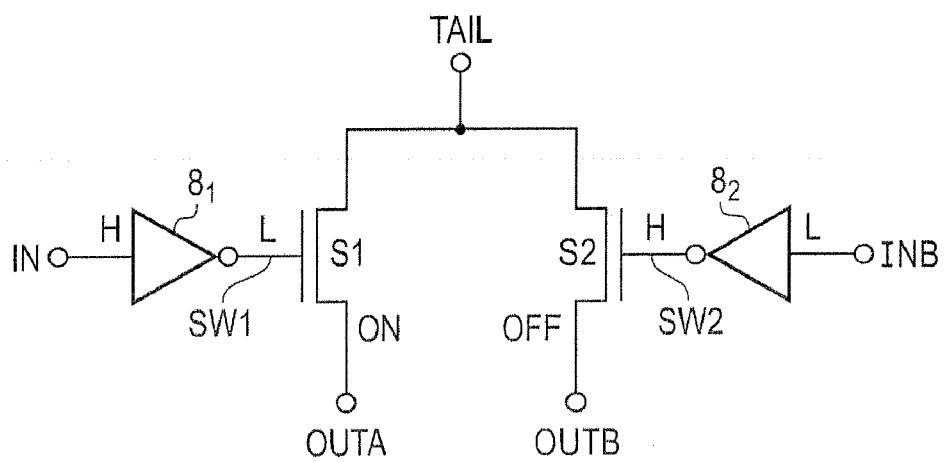

In a segmented architecture, for example a segmented DAC as described with reference to FIGS. 1 and 2, there may be a plurality of individual segments, each including the differential switching circuitry of FIG. 3. In this case, the reference transistor 34 in the FIG. 7 example may be used in common to calibrate all of the segments. As well as saving circuitry, this may have the further advantage that all of the transistors in all of the segments are calibrated against the same reference transistor. This should mean that the variations between segments are reduced, as well as variations between the two transistors per segment. However, it is not essential to provide a reference transistor in common for all segments. It is possible to provide a reference transistor for each segment. In practice, the primary source of distortion arising from the mismatch in switching delays is mismatch between the different transistors in the same segment, rather than mismatch between switching delays of transistors in different segments. Also, it is found that in a practical integrated-circuit implementation of a segmented DAC, there may be significant process-related gradients from one side of the chip to the other which can make some segments have significant variations from other segments. If a single reference transistor 34 is used for all segments, it may be necessary to provide the adjustment circuit 20 with a very large adjustment range to cope with the variations across the segments. However, if there is a dedicated reference transistor per segment (or perhaps per group of segments), and the reference transistor is formed physically close to the first and second transistors S1 and S2 to be calibrated in the segments (or group of segments), then such a large adjustment range is unnecessary.

Figure 8:
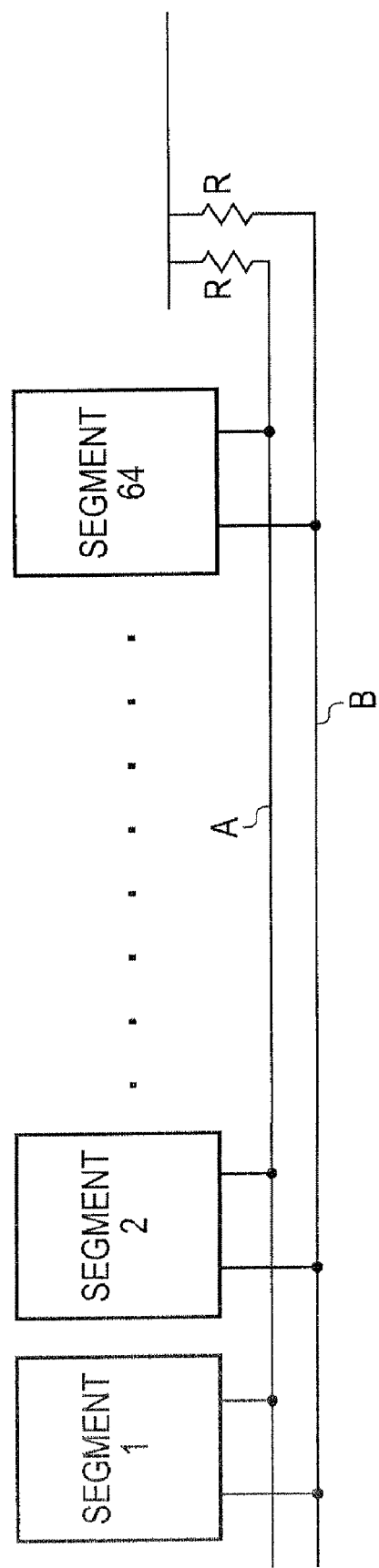
FIG. 8 shows parts of segmented switching circuitry embodying the present invention.

In a segmented architecture, it will generally be desirable to calibrate the transistors in the segments during actual operation of the circuitry. In other words, one or more of the segments will be in the calibration mode at the same time as the remaining segments are in the normal operation mode. One way of achieving this is shown schematically in FIG. 8. In this example, it is assumed that the segmented circuitry has 64 individual segments. At any given time, one of these segments is in the calibration mode and the remaining 63 segments are in the normal operating mode. To make this possible, it is simply necessary to provide one extra segment. In practice, only 63 segments are needed to produce 64 different outputs. For example, in a segmented DAC, for the digital input value 0 all 63 segments are connected to the same line, for example the line B in FIG. 8. For the digital input value 63, 63 segments need to be connected to the other one of the lines, for example the line A in FIG. 8. Accordingly, by providing 64 segments in total, one of the 64 segments can be calibrated at any given time whilst there are still 63 remaining segments available to produce the analog output signal.

The calibration is preferably carried out in an ongoing manner whilst the circuitry is operating since the threshold voltages of the transistors in the differential switching circuitry do change over time (due to ageing) and also with other factors such as temperature. The rate of change of the threshold voltages is relatively slow, however, so the interval between different calibration operations can be relatively long, for example milliseconds. In a high-speed DAC, for example, the interval could be 100 s or 1000 s of clock cycles. It is of course unnecessary to carry out the calibration in an ongoing manner. For example, it would be possible to carry out it out as a one-off exercise, either when the circuitry is first used or each time it is powered up.

Also, in some applications, it may be possible to suspend operation of the circuitry temporarily, and carry out the calibration during such a suspended operation period. In this case, it will be unnecessary to provide extra segments to enable the circuitry to continue to operate during the calibration operation.

Because the calibration for different segments is carried out sequentially, it is unnecessary for each calibration operation to be completed in one step. For example, the adjustment section 24 in FIG. 6 or the adjustment section 32 in FIG. 7 may be arranged to adjust the relevant bulk voltage in relatively small steps. For example, each time a segment is placed into the calibration mode, a measurement of the currents $i_1$ and $i_2$ (or $i_1/i_2$ and $I_{REF}$) may be taken and, in dependence upon the result, bulk voltage may be adjusted upwardly or by a fixed small amount. Accordingly, over a series of such calibration operations a segment will be adjusted so that it has the appropriate bulk voltage, without any large changes in the bulk voltage in a small period of time. This may have advantages in terms of stability of the circuitry. Of course, in order to achieve this kind of adjustment, the adjustment circuit must have a memory function so that it can store the latest value of the bulk voltage required for a particular transistor in a particular segment for use when the next calibration operation for that transistor is carried out. One possibility is to provide a digital memory having sufficient capacity to store a digital value for each transistor to be calibrated. This digital value can then be applied to a digital-to-analog converter to produce the required analog bulk voltage.

Another property which can be measured and used to adjust the bulk voltage is the tail voltage $V_{TAIL}$. One possibility is to measure $V_{TAIL}$ when S1 is on and S2 is off and compare this to a reference value, and then adjust VA until $V_{TAIL}$ has the reference value. $V_{TAIL}$ can be measured again when S2 is on and S1 is off, and VB is adjusted until $V_{TAIL}$ has the reference value. In this case, it is preferable to connect a current bleed circuit in parallel with the transistor that is on, the bleed circuit drawing I/2 from the tail node, so that the tail voltage is measured with I/2 flowing through the transistor under test.

Figure 9:
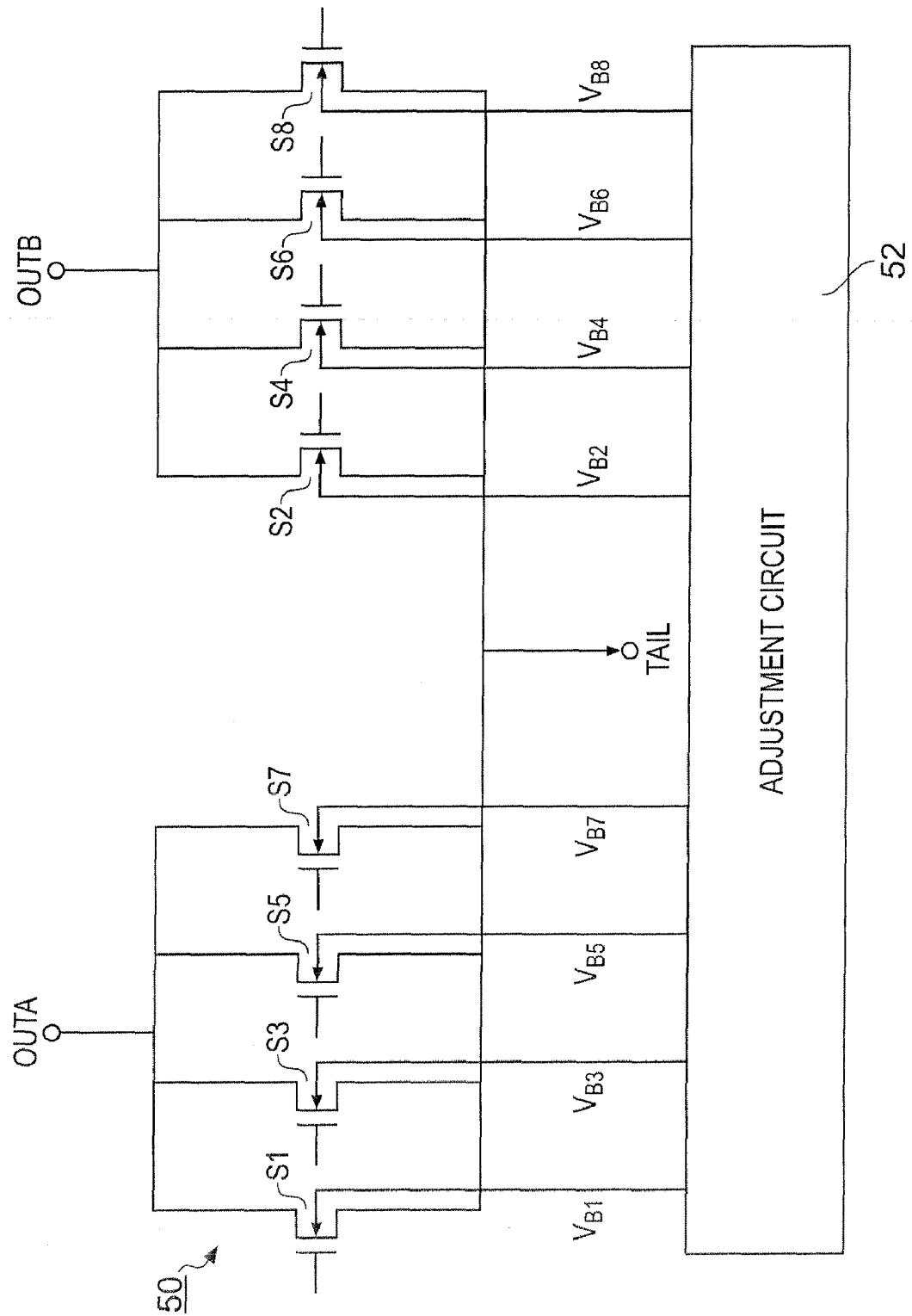
FIG. 9 shows parts of switching circuitry according to a second embodiment of the present invention.

Next, a second embodiment of the present invention will be described in which the differential switching circuitry is modified to have more than one transistor per output node. For example, as shown in FIG. 9, four transistors S1, S3, S5 and S7 are connected in parallel between a common node TAIL and a first output node OUTA. Similarly, four transistors S2, S4, S6 and S8 are connected in parallel between the common node TAIL and a second output node OUTB. The differential switching circuitry 50 in this case operates in a repeating series of four phases.

In the first phase, one of the pair of switches S1 and S2 is turned on and the other switch of that pair is turned off in dependence upon a data signal. All of the remaining switches S3 to S8 are maintained in the off state in the first phase.

In the second phase, the switches S1 and S2 are turned off. One of the switches of the pair of switches S3 and S4 is turned on and the other switch of that pair is turned off in dependence upon the data signal. The switches S5 to S8 remain off.

In the third phase, the switches S3 and S4 are turned off and one of the switches of the pair of switches S5 and S6 is turned on and the other switch of that pair is turned off in dependence upon the data signal. The switches S1, S2, S7 and S8 remain off.

Finally, in the fourth phase, the switches S5 and S6 are turned off. One of the switches of the pair of switches S7 and 38 is turned on and the other switch of that pair is turned off in dependence upon the data signal. The remaining switches S1 to S4 remain off. The fourth phase in this cycle is then followed by the first phase of the next cycle, and so on in a repeating manner.

It will be understood that, with this switching arrangement, only one of the switches S1 to S8 is on at any given time, and all of the remaining switches are turned off. Accordingly, the outputs from the differential switching circuitry of FIG. 9 are the same as if only one pair of switches was provided as in FIG. 3. However, because of the plural switches per output node, it can be arranged that, irrespective of the change in the data signal from one phase to the next, the same number of switches change state. For example, if in the first phase the switch S1 is on and the switch S2 is off and the data signal remains the same in the second phase, the switch S1 will turn off at the beginning of the second phase and the switch S3 will turn on. This means that one switch is always turning on at the same time as another switch is turning off. In the FIG. 3 circuitry, there is no change in the switch state if the data signal stays the same from one cycle to the next.

The FIG. 9 arrangement can assist in solving the problem of third-order distortion in a DAC. Third order distortion is particularly undesirable in DACs which produce multi-tone output signals, since third order intermodulation distortion may occur in-band, in which case it cannot be removed by filtering. The third order distortion is believed to be due in part to currents flowing into and out of parasitic capacitances which are present in the differential switching circuitry. By arranging for the same number of switches to change state from one phase to the next, the charge which flows into and out of the parasitic capacitances becomes less dependent on the input data signal. This helps to reduce third order distortion in the analog output signal. Also, by arranging the same number of switches to change state in each cycle, the current drawn by each analog segment is approximately the same in each cycle. This may help to reduce variations in the timings of the switching operations of the various analog segments and thereby reduce distortion.

Further details of the FIG. 9 circuitry may be found, for example, in the applicant's earlier patent publication EP-A-1292035, the entire content of which is incorporated herein by reference.

Incidentally, although FIG. 9 shows an example in which there are four switches per output node, the number of switches is not limited to four and two or more switches may be provided per output node.

When a plurality of switches are provided per output node, as in FIG. 9, it is desirable to be able to adjust the bulk voltages of the transistors used to implement these switches individually so as to take account of threshold voltage variations between those transistors which would otherwise result in mismatch between the switching characteristics of those transistors. In particular, as shown in FIG. 9, the differential switching circuitry 50 is provided with an adjustment circuit 52 that supplies an individually-adjustable bulk voltage $V_{B1}$ to $V_{B8}$ to each of the transistors S1 to S8. In practice it is not essential to be able to adjust the bulk voltages of all the transistors S1 to S8; it would be sufficient to adjust all but one of them (7 in this example), the bulk voltage of one of the transistors being fixed (unadjustable).

In the second embodiment, it is possible for the adjustment circuit 52 to operate in the same basic manner as in the first embodiment (FIG. 5). However, in this case, whereas the FIG. 5 circuitry has the three selection switches SW1 to SW3 for the transistor S1 and the three selection switches SW4 to SW6 for the transistor S2, the circuitry of FIG. 9 may need three such selection switches per transistor S1 to S8.

For example, the transistors S1 to S8 may be selected individually in turn and calculated against a reference transistor. The selected transistor and the reference transistor are turned on at the same time and the respective currents flowing through the two transistors are measured and compared using an arrangement of the kind described previously with reference to FIG. 6. The bulk voltage of the selected transistor is then adjusted until the respective currents flowing through the selected transistor and the reference transistor are the same. This process is repeated for each one of the transistors S1 to S8, each time adjusting the bulk voltage of the selected transistor, so that eventually the whole set of transistors is calibrated.

It will be appreciated that, as in the FIG. 6 example described previously, by turning on the selected transistor and the reference transistor at the same time, each transistor is measured when carrying half of the current flowing through the tail node, which is the same current that flows through the transistor at the switching point in the normal operating mode.

It is also possible to calibrate the transistors S1 to S8 sequentially against the same reference transistor, as in the FIG. 7 example described previously.

Another possibility is for the adjustment circuit 52 to carry out so-called AC calibration. The basic idea of this AC calibration is to measure the average current flowing through each transistor whilst the transistor is switching and force this to be the same for all transistors S1 to S8. This is more difficult to implement in practice but has the advantage of potentially removing other dynamic sources of error since the measurements are taken whilst the transistors are actually switching.

Referring to FIG. 10, the adjustment circuit 52 may comprise a measurement section 62 and an adjustment section 64. The adjustment section 62 comprises first and second p-type transistors 66 and 68. The gates of the transistors 66 and 68 are connected together and the gate and drain of the transistor 68 are also connected together. The sources of the transistors 66 and 68 are connected to a positive supply line VDD. The drain of the transistor 66 is connected to the respective drains of the transistors S1, S3, S5 and S7. The drain of the transistor 68 is connected to the respective drains of the transistors S2, S4, S6 and S8. The transistors 66 and 68 are identical but are much larger than the transistors S1 to S8.

The FIG. 10 circuitry performs the calibration in a series of eight steps, as follows. Each step has eight phases and treats a different one of the transistors S1 to S8 as a target transistor. In practice, each step may involve multiple sequences of the eight phases, because what is measured in this case is an average current, and a sufficient number of phases should be used to cause the average currents to converge to particular values before the end of each step. The transistors 66 and 68 constitute a 1:1 current mirror which, in each step, tend to make an average current flowing through the transistor 66 equal to an average current flowing through the transistor 68.

Step 1

Step 1 is shown in FIG. 11(A). In this step, the target transistor is the transistor S1. This transistor is turned on in every even-numbered phase and all the other transistors S2 to S8 are turned off. In phase 1, the transistor S2 alone is turned on and all of the other transistors are turned off. In phase 3, the transistor S4 alone is turned on and all the other transistors are turned off. In phase 5, the transistor S6 alone is turned on and all the other transistors are turned off. In phase 7 the transistor S8 is turned on alone and all of the other transistors are turned off.

The measurement section 62 measures an average current flowing through the transistor S1. The measured average current is represented by the signal V1. Similarly, the average current flowing through the transistors S2, S4, S6 and S8 respectively is measured. The measured average current is represented by the signal V2. By subtracting the average value of V2 from the average value of V1 the error in S1 relative to the average of the errors in S2, S4, S6 and S8 can be detected.

It is also possible to take samples of, say, the instantaneous difference between V1 and V2 in each phase, and average these samples. One possibility is to make transistors 66 and 68 so large that they have big parasitic capacitances and therefore do the averaging automatically, i.e. $V1-V2=(e_1-e_2-e_4-e_6-e_8)$. In this case, V1 and V2 converge to substantially the sequence of constant values over phases of step 1.

The adjustment section 64 then adjusts the bulk voltage $V_{B1}$ applied to the transistor S1 so as to reduce the error in S1 relative to the average error in S2, S4, S6 and S8. As described previously, the adjustment section 64 may be adapted to apply only a fixed small increment or decrement to the bulk voltage each time step 1 is carried out so that the bulk voltage is adjusted stepwise by small amounts over a series of steps.

It will be appreciated that in step 1 a series of switching events take place. The first switching event is S1 turning off and S4 turning on. The second switching event is S4 turning off and S1 turning on. There is one such switching event per phase. At each switching event, an average of the errors of the two transistors involved in the event is represented by the difference between V1 and V2.

Step 2

In step 2 the target transistor is the transistor S3. As shown in FIG. 11(B), this transistor is turned on in all of the even-numbered phases. The remaining switches S1, S2 and S4 to S8 are all off. In odd-numbered phases the transistors S2, S4, S6 and S8 are selected sequentially in the same way as in step 1. In this case, the difference between the average value of V1 and the average value of V2 represents the difference between the error in S3 and the average of the errors in S2, S4, S6 and S8. This is then used by the adjustment section 64 to change the bulk voltage $V_{B3}$ applied to the transistor S3.

Steps 3 and 4

These steps are shown in FIGS. 11(C) and 11(D). The target transistors are S5 and S7. The bulk voltages $V_{B5}$ and $V_{B7}$ are adjusted accordingly.

Step 5

In step 5 the target transistor is the transistor S2. This is turned on in every odd-numbered phase, all the other transistors S1 and S3 to S8 being turned off. In successive even-numbered phases the transistors S1, S3, S5 and S7 are turned on respectively. As a result, the difference between the average value of V2 and the average value of V1 represents the difference between the error in S2 and an average of the errors in S1, S3, S5 and S7. The bulk voltage $V_{B2}$ of S2 is adjusted accordingly.

Steps 6 to 8

These are illustrated in FIGS. 11(F), 11(G) and 11(H). They are the same as step 5 except that the target transistor is the transistor S4, S6 or S8 instead of the transistor S2.

By carrying out the steps S1 to S8 many times in succession, the bulk voltages $V_{B1}$ to $V_{B8}$ gradually converge to the values needed to compensate for the threshold voltage variations between the transistors. The measurements of V1 and V2 are taken when the transistors are changing state (as well as in the steady state) so that other variations between the transistors (in addition to threshold variations) that influence the switching performance are also taken into account.

In the FIG. 11 example, the transistors are calibrated in groups of five transistors. One transistor in each group is a target transistor connected to one output node OUTA or OUTB and the remaining 4 transistors are the transistors connected to the other output node OUTB or OUTA. Although, in this example, only the bulk voltage of the target transistor of each group is adjusted, it is also possible to adjust the other members of the group, for example by ¼ of the adjustment applied to the target transistor and in the opposite direction to the adjustment applied to the target transistor.

Another possible way of performing AC calibration using the FIG. 10 circuitry is to calibrate the transistors in groups of four transistors, one of the four transistors being the target transistor connected to one output node and the three remaining transistors being the three transistors connected to the other output node that, in normal operation of the circuitry, are used in different phases from the target transistor. Thus, the groups are [S1 S4 S6 S8], [S2 S3 S6 S8], [S2 S4 S5 S8], [S2 S4 S6 S7], [S2 S3 S5 S7], [S1 S4 S5 S7], [S1 S3 S6 S7] and [S1 S3 S5 S8]. Here, the underlined transistor is the target transistor of each group.

The FIG. 10 circuitry needs to be modified in this case by making the current ratio of the current mirror 1:3 instead of 1:1 in the FIG. 11 example. For the group [S1 S4 S6 S8], S1 only is on in phase 1, S4 only is on in phase 2, S6 only is on in phase 3 and S8 only is on in phase 4. Over the course of all 4 phases, the transistor S1 has I flowing through it one quarter of the time and the transistors S4, S6 and S8 together have I flowing through them three quarters of the time.

If the transistors 66 and 68 are large and have large parasitic capacitances, then the currents in the transistors 66 and 68 can only follow the variations in the currents in the transistors S1, S4, S6 and S8 slowly. This means that the current in the transistor 66 becomes equal to the average current in the transistor S1 over the 4 phases, i.e. $(I+e_1)/4$, where $e_1$ is the error in S1. Similarly, the current in the transistor 68 becomes equal to the average current in the transistors S4, S6 and S8 over the 4 phases, i.e. $((I+e_4)/4+(I+e_6)/4+(I+e_8)/4)=3I/4+$ $(e_4+e_6+e_8)/4$. The difference between the average currents in the transistors 66 and 68 is therefore $\frac{1}{4}(3e_1-(e_4+e_6+e_8))$. When V1−V2=0, $3e_1=e_4+e_6+e_8$. The switching events for the group [S1, S4, S6, S8] are S1 turning off and S4 turning on (first switching event) and S8 turning off and S1 turning on (second switching event). This means that the results obtained reflect only the error of S1 vs. S4 and the error of S1 vs. S8, with no account taken of the error of S1 vs. S6. In this case, therefore, V1−V2 should be made 0 when $2e_1-e_8-e_6=0$. However, the weighting of $e_1$ in the averaging process is 3 times that of each of $e_1$ and $e_8$ (the current mirror has a 1:3 ratio). This means that the adjustment $V_{B1}$ for S1 may not be an optimum value. However, provided that the number of switching events involving S1 (two in this case) is greater than the number of switching events involving each other group member, this method will still cause the bulk voltages to converge to the correct values.

The advantage of this calibration method is that no group of calibration transistors contains two transistors that are used in the same phase in normal operation. Accordingly, the driver circuits used to drive the gates of the transistors S1 to S8 can also be used to apply the drive signals to the gates of the transistors S1 to S8 during the calibration operation. This simplifies the calibration circuitry and even enables errors associated with the driver circuits to be taken account of in the calibration operation, as well as errors in the threshold voltages of the transistors S1 to S8.

Next, another possible implementation of the adjustment circuit 52 in the second embodiment will be described with reference to FIG. 12.

In FIG. 12, the adjustment circuit comprises a main adjustment section 70, a reference adjustment section 72, a reference generator section 74, a comparator 76, a control section 78 and a compensation section 80.

The main adjustment section 70 comprises a separate accumulator (digital register) 90-1 to 90-8 for each of the transistors S1 to S8 in the differential switching circuitry to be calibrated. Each accumulator 90-1 and 90-8 is connected to a corresponding DAC 91-1 to 91-8. Each DAC 91-1 to 91-8 supplies an individually-adjustable bulk voltage $V_{B1}$ to $V_{B8}$ to its corresponding transistor.

The reference generator section 74 comprises 8 transistors 94-1 to 94-8. Each of these transistors is nominally identical and identical to each of the transistors S1 to S8 in the differential switching circuitry. The drains of all of the transistors 94-1 to 94-8 are connected together, the gates of the transistors 94-1 to 94-8 are connected together, and the sources of the transistors 94-1 to 94-8 are connected together to a common node REFTAIL. A current sink 84 is connected between the node REFTAIL and GND. Each of the transistors 94-1 to 94-8 has its own individually-adjustable bulk voltage $V_{BR1}$ to $V_{BR8}$.

The reference adjustment section 72 comprises 8 accumulators (digital registers) 92-1 to 92-8) and 8 DACs 93-1 to 93-8. Each DAC 93-1 to 93-8 supplies one of the adjustable bulk voltages $V_{BR1}$ to $V_{BR8}$ to a corresponding one of the transistors 94-1 to 94-8 in the reference generator section 74.

The comparator 76 has a first input connected to the common node TAIL of the differential switching circuitry. The second input of the comparator 76 is connected to the common node REFTAIL in the reference generator section 74.

The comparator 76 produces an output signal COMP which is applied to the control section 78. The control section 78 supplies control signals REFADJ to the reference adjustment section 72 and control signals MAINADJ to the main adjustment section 70.

The compensation section 80 is connected to the output terminals OUTA and OUTB.

Operation of the FIG. 12 circuitry will now be described. The basic idea underlying the FIG. 12 adjustment circuit is to adjust the bulk voltages of the transistors S1 to S8 without having to isolate them from the output nodes OUTA and OUTB and the common node TAIL. In practice, although it is possible to devise circuitry to achieve such isolation, the isolating circuitry can have other disadvantageous properties, especially in a DAC which is intended to operate at high speed.

In the FIG. 12 adjustment circuit, instead of measuring the current that flows through each of the transistors S1 to S8 during calibration, the potential of the common node TAIL (hereinafter the tail voltage) $V_{TAIL}$ is measured. This avoids the need to disconnect the transistors from the tail node during the calibration. The need to disconnect the transistors from the output nodes is avoided by providing the compensation section 80, as explained later.

In order to measure the tail voltage for each transistor when the transistor is carrying the current at the switching point of the differential switching circuitry, the transistors are turned on in pairs. In this case, the tail voltage is influenced by the respective errors in the two switches of the pair. In particular, the error in the tail voltage is the average of the errors in the two transistors of the pair that are on. For each transistor, the other 7 transistors are turned on in succession, so the tail voltage at any time will be influenced by the average of the errors of the two transistors that are on.

For example, assume that in a first calibration step (step 1) the target transistor is the transistor S1. This transistor is turned on, and then the remaining transistors S2 to S8 are turned on in turn. The tail-voltage errors will be:

$$S1 + S2: (e1 + e2)/2$$
$$S1 + S3: (e1 + e3)/2$$
$$S1 + S4: (e1 + e4)/2$$
$$\vdots$$
$$S1 + S8: (e1 + e8)/2$$

The total error $e_{tot} = (7e1 + e2 + e3 + \ldots e8)/2$

In this way, the target transistor being calibrated makes seven times the contribution to the total error of each of the other seven transistors. The errors e2 to e8 of those other transistors tend to average out, so it is effective to use this average to adjust the bulk voltage $V_{B1}$ of the transistor S1. This will only work if there are three or more switches in total in the differential switching circuitry so that the error contribution from the target transistor for calibration is larger than the average of the errors of the remaining transistors. In practice, because there will usually be the same number of transistors for each output node, the minimum likely number of switches in total is 4, rather than 3.

The comparator 76 receives the tail voltage $V_{TAIL}$ at its first input. At its second input it receives a reference tail voltage $V_{REFTAIL}$ produced by the reference generator section 74 at the common node REFTAIL. Each of the transistors 94-1 to 94-8 in the reference generator section 74 is always turned on and the current sink 84 causes a current of I/2 to flow through each of the transistors 94-1 to 94-8. Thus, the total current sunk by the current sink 84 is 8×(I/2)=4I. Here I is the current sunk by the current sink 82 in the differential switching circuitry itself. The reason for providing eight transistors 94-1 to 94-8 in the reference generator section 74 is that these transistors will also have threshold voltage variations between them. By using eight transistors and connecting them in parallel, the variations in threshold voltage between the different transistors 94-1 to 94-8 are averaged out. Thus, the parallel-connected transistors 94-1 to 94-8 serve to generate at the common node REFTAIL a reference tail voltage $V_{REFTAIL}$ that contains an error related to the average of the individual errors of the transistors 94-1 to 94-8.

The comparator 76 compares the tail voltage $V_{TAIL}$ with the reference tail voltage $V_{REFTAIL}$. The output signal COMP of the comparator 76 merely represents the sign of the comparison result between $V_{TAIL}$ and $V_{REFTAIL}$. Accordingly, COMP=+1 when $V_{TAIL} > V_{REFTAIL}$ and COMP=−1 when $V_{TAIL} \leq V_{REFTAIL}$. It is sufficient to rely on only the sign of the comparison result for practical purposes and to ignore the magnitude. The effect of ignoring the magnitude is to slow down convergence. This is acceptable because variations in threshold voltage are relatively slow, so speed is not important. The use of a simple comparator as opposed, for example, to an analog-to-digital converter, enables the circuitry to operate quickly and at lower power.

Thus, in step 1, the comparator 76 produces a series of seven comparison results for the target transistor S1, each representing the sign of the comparison result (+1/−1) for a different pair of transistors including the target transistor S1 and one of the seven other transistors S2 to S8. The comparison results are summed to produce a total error in the range from −7 to +7. The total error is added into the accumulator 90-1 corresponding to S1. This accumulator is connected to the DAC 91-1 corresponding to S1. The accumulator has upper and lower bits. Only the upper bits of the accumulator are supplied to the DAC 91-1. The particular upper bits of the accumulator which are used to provide the input code to each DAC 91 are controlled by a parameter GAIN applied to the accumulators 90-1 to 90-8. The higher the parameter GAIN, the more comparison results are needed before digital input code applied to each DAC 91-1 to 91-8 is incremented or decremented. For example, the gain parameter may be set to 0.25, as described later. For each factor of two reduction in the GAIN parameter the DAC input code is taken from a higher set of bits of the accumulator.

Accordingly, after completing the seven comparisons for the target transistor S1, the accumulator 90-1 for S1 is updated according to the total error and the updated accumulator output is supplied to the DAC 91-1. As a result, the bulk voltage VB1 for the transistor S1 is adjusted.

Of course, adjusting the bulk voltage $V_{B1}$ of the transistor S1 will not only have an effect on the individual error $e_1$ of that transistor but will also have an effect on the average error of the transistors S1 to S8 as a whole. The intention of the adjustment process is really only to remove the mismatches in the switching delays of the transistors S1 to S8, and it is not desirable to change the average error, for example to reduce it to some target value. For example, instead of adjusting the accumulators 90-1 to 90-8 by [+e 0 0 0 0 0 0 0] where e is the total error (range −7 to +7 as described before), the control section 78 adjusts them by [+7/8e −e/8−e/8 −e/8 −e/8 −e/8 −e/8 −e/8], so that there is no change in the average of the accumulator values (this average value will always be close to 0). Also, to compensate for the addition of −e/8 to all of the accumulators 90-1 to 90-8, adjustments are also made to the accumulators 92-1 to 92-8 in the reference adjustment section 72. Since there are eight such accumulators, each associated with a different one of the transistors 94-1 to 94-8 an update is made only to one of the accumulators 92-1 to 92-8, for example the accumulator 92-1. This accumulator 92-1 is adjusted by −e/8. As a result, the change seen by the comparator 76 is still [+e 0 0 0 0 0 0 0] as intended. The effect of adjusting over time the accumulators 92-1 to 92-8 in the reference adjustment section 72 is that the reference tail voltage $V_{REFTAIL}$ converges to the average tail voltage $V_{TAIL}$ of the transistors S1 to S8 (plus any offset in the comparator 76 and any difference between the average errors in the transistors S1 to S8 and the average of the errors of the transistors 94-1 to 94-8 in the reference generator section 74). However, the required adjustment to the reference tail voltage is well within the adjustment range of the transistors 94-1 to 94-8.

After performing the seven comparisons for the target transistor S1 in step 1, the calibration process moves to the next target transistor, which is S2, in step 2. For the target transistor S2, comparison results are obtained between $V_{TAIL}$ and $V_{REFTAIL}$ for all seven pairs of transistors including the target transistor and each of the remaining transistors S1 and S3 to S8. The control section 78 determines a total error by summing the comparison results. This total error is used to adjust the accumulator 90-2 corresponding to S2 and one of the accumulators 92-1 to 92-8 in the reference adjustment section 72.

Incidentally, it would be possible to perform the comparisons for all eight target transistors and then perform all the adjustments to the accumulators in one go. However, in practice it is found that this tends to make the accumulator values jump between a small number (perhaps just two) of sets of results ("bang-bang") behaviour. Effectively the calibration process is using a loop to perform adjustments and it is found that the operation of the loop is much smoother if each target transistor is considered in turn and adjustments to the bulk voltages (and the bulk voltage of one of the transistors 94-1 to 94-8 in the reference generator section 74) are carried out before the operation moves to the next target transistor. The total change is similar but happens in eight small steps instead of one big step. The repetitive sequences are broken up which randomises the loop noise.

After carrying out step 2 for the target transistor S2, the calibration process is applied to the transistor S3 as the next target transistor in step 3, and so on until all eight transistors have been subjected to a calibration step. Thereafter, the calibration process continues step by step sequentially through the transistors S1 to S8.

It will be appreciated that when the one of transistors S1 to S8 that is the target transistor at a particular time is being adjusted, the corresponding adjustment in the reference adjustment section 72 may be to any of the transistors 94-1 to 94-8. It is therefore possible for increments in the reference section to take an ordered stepwise pattern such that the accumulators 92-1 to 92-8 are incremented one-by-one in a loop pattern over time, as will be appreciated later with regard to FIG. 13(E). In FIG. 13(E), it can be seen that increments (in this case, negative increments, i.e. decrements) are made in respect of transistors 94-1 to 94-8 one by one in order, looping back to the first one when the last has been decremented. When a particular one of the transistors 94-1 to 94-8 is the next to be decremented, that decrement is made at the next time that a decrement in the reference adjustment section 72 is required. If the next adjustment turns out to be an increment rather than a decrement, that increment is made to the previous transistor to maintain the stepwise pattern.

FIGS. 13(A) to 13(H) show graphically how the FIG. 12 circuitry operates. The results shown in FIGS. 13(A) to 13(H) were obtained by simulation and assume that the eight transistors S1 to S8 have random threshold voltage variations. Similarly, it is assumed that the transistors 94-1 to 94-8 in the reference generator section 74 also have threshold voltage variations. In each of the graphs, the horizontal axis represents the number of adjustments to the accumulators 91-1 to 91-8 carried out by the control section 78 during the course of the calibration process, i.e. the number of calibration steps carried out. Of course the number of comparison operations performed by the comparator 76 is seven times larger than this figure. Also, in each graph, the vertical axis has a scale measured in terms of the least-significant bits (LSBs) of each of the DACs 91-1 to 91-8 and 93-1 to 93-8.

Figure 13A:
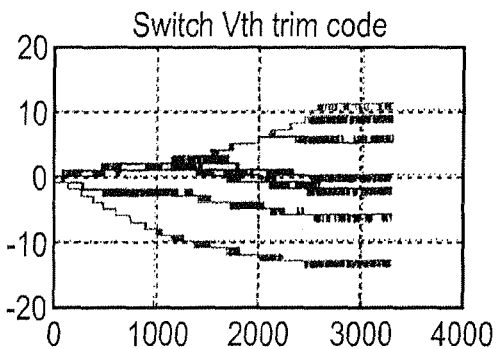

FIGS. 13(A) to 13(D) and 13(H) all relate to the transistors S1 to S8. In each of FIGS. 13(A) to 13(D) each individual line represents a characteristic of one of the transistors S1 to S8. In particular, FIG. 13(A) shows the input of the DAC 91-1 to 91-8 corresponding to each of the transistors S1 to S8. As can be seen from FIG. 13(A), initially, the input of each DAC 91-1 to 91-8 is at 0. During the course of the calibration process, the DAC inputs are adjusted by the control section 78 in dependence upon the comparison results. Eventually, the DAC inputs stabilise at values suitable for reducing the mismatches in switching delay between the different transistors.

Figure 13B:
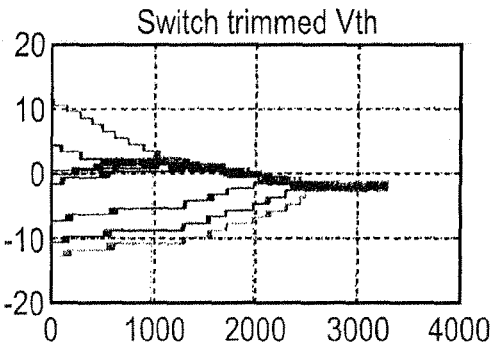

FIG. 13(B) shows how the threshold voltage of each of the transistors S1 to S8 is changed over the course of the calibration process. Initially, as shown in the graph, the transistors S1 to S8 have significant threshold voltage variations (more than 20 LSBs) from lowest to highest. An average of the threshold voltages will not be precisely 0. Over the course of the calibration process, it can be seen that the threshold voltages are adjusted (by changing the bulk voltages) so that the differences between the threshold voltages of individual transistors are cancelled out. The average threshold voltage at the end of the calibration process is, however, unchanged from the average threshold voltage at the beginning of the calibration process. The reason for this is that, as explained with reference to FIG. 12, it is not an object of the calibration process to adjust the average errors of the transistors S1 to S8. The only object is to reduce the differences between them.

Figure 13C:
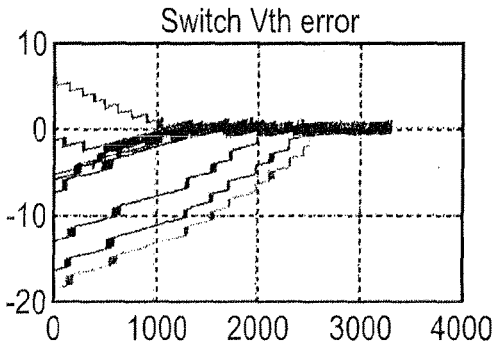
Figure 13D:
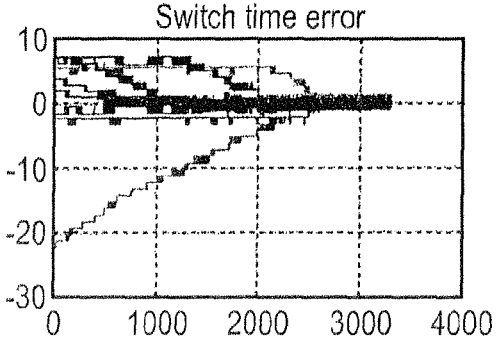
Figure 13E:
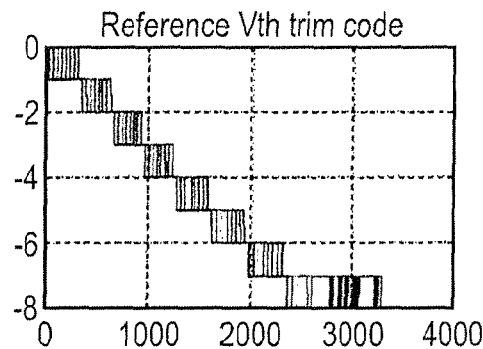
Figure 13F:
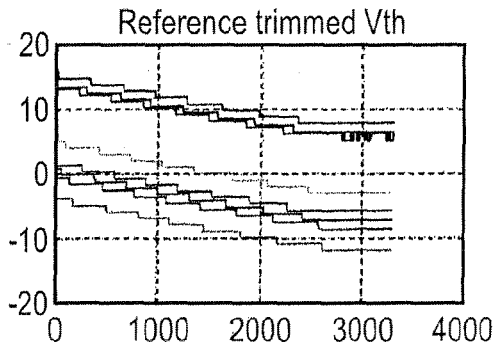
Figure 13G:
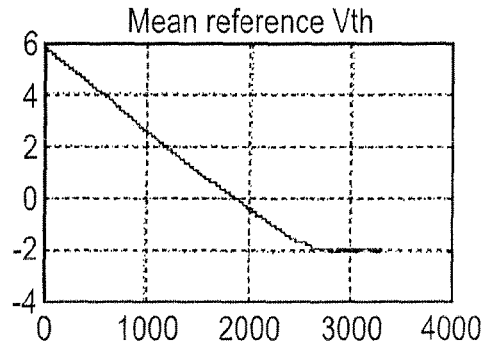

FIGS. 13(E) to 13(G) show properties of the transistors 94-1 to 94-8 in the reference generator section 74 during the calibration process. Again, as shown in FIG. 13(E), initially, each of the inputs of the DACs 93-1 to 93-8 has a value of 0. Again, each different line in FIGS. 13(E) (and 13(F)) relates to a different one of the transistors 94-1 to 94-8. FIG. 13(E) shows how the input to each of the DACs 93-1 to 93-8 changes over the course of the calibration process. It can be seen that each DAC input changes quite slowly. For example, the interval between changes of one LSB for a given DAC is around 300 steps. Because there are 8 DACs, each of which changes by one LSB over the course of the 300 steps, the effective rate of change of the reference generator section is the same as the rate of change of the individual changes to the DACs, i.e. around one LSB per 300 calibration steps, except that it is carried out in 8 steps per LSB instead of 1 step per LSB.

FIG. 13(F) shows how the changes in the DAC inputs affect the threshold voltages of the transistors 94-1 to 94-8. It can be seen that each threshold voltage changes by one LSB every 300 or so calibration steps, and that the threshold-voltage changes are staggered from one transistor to the next. The differences between the threshold voltages of different transistors are maintained the same over the course of the operation.

FIG. 13(G) shows the average of the threshold voltages in FIG. 13(F). It can be seen that in this example the average value changes from around +6 to around −2. This final value of −2 is the same as the average value of the threshold voltages (as adjusted) of the transistors S1 to S8 (see the final values in FIG. 13(B)). It can be seen from FIG. 13(G) that the effective resolution of the average of the threshold voltages of the reference transistors is 8 times the resolution of each individual reference transistor. It is the difference between the threshold voltage of each individual transistor S1 to S8 and the average threshold voltage of the reference transistors that drives the loop. Accordingly, having a higher resolution for this average threshold voltage is useful.

FIG. 13(C) shows the difference between the adjusted threshold voltage of each transistor S1 to S8 (FIG. 13(B)) and the average threshold voltage of the reference transistors (FIG. 13(G)). This can be regarded as the threshold voltage error of the transistor S1 to S8 concerned. As can be seen, the error for each transistor becomes close to 0 and, at this point, the adjusted threshold voltage for the transistor concerned (FIG. 13(B)) is close to the average threshold voltage of the reference transistors (around −2).

To simulate the effect of the differences in threshold voltage between different transistors in terms of switching delay mismatch, the differences in threshold voltage from one transistor to the next were considered. For example, it can be considered that the switching-delay error for the transistor S1 is dependent on the difference between the threshold voltage for that transistor and the threshold voltage for the transistor S2. Similarly, it can be considered that the switching delay mismatch for the transistor S2 is dependent on the difference between the threshold voltage for that transistor and the threshold voltage for the transistor S3, and so on for all of the remaining pairs of successive transistors. The results are shown in FIG. 13(D), which is obtained by taking the differences between pairs of transistors in FIG. 13(B)).

Figure 13H:
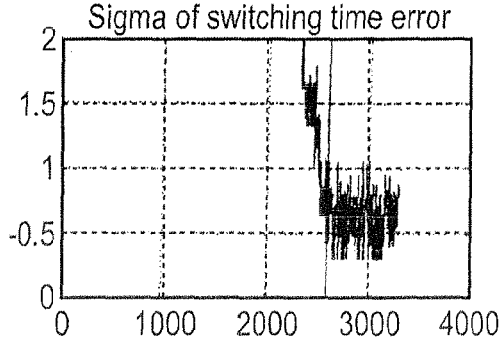

Finally, FIG. 13(H) shows the standard deviation a of the switching delay mismatches of the transistors S1 to S8 in FIG. 13(D). Initially, the standard deviation of the mismatch is way above the full scale of the graph in FIG. 13(H) and only comes into view after the threshold voltages have converged sufficiently (after around 2,500 calibration steps in this example).

After that, it can be seen that the standard deviation of the switching delay mismatches becomes very small, for example just over 0.5 LSBs. The inventors have investigated by simulation which values of the parameter GAIN provide the best results. Table 1 below presents the comparison results for different values of the gain parameter.

TABLE 1

| Gain | Mean | σ | Min | Max | −3σ | +3σ |
|---|---|---|---|---|---|---|
| 0.125 | 0.642 | 0.04 | 0.52 | 0.75 | 0.5 | 0.77 |
| 0.25 | 0.657 | 0.033 | 0.54 | 0.76 | 0.56 | 0.75 |
| 0.5 | 0.691 | 0.036 | 0.54 | 0.78 | 0.58 | 0.80 |
| 1.0 | 0.746 | 0.028 | 0.70 | 0.81 | 0.68 | 0.81 |
| 2 | 1.136 | 0.027 | 1.08 | 1.24 | 1.05 | 1.22 |

Each set of results was obtained by performing 100 runs, each run starting with a different randomly-generated set of threshold voltage variations among the transistors S1 to S8. Referring to FIG. 13(H) it can be seen that after the threshold voltages have converged (FIG. 13(B)), i.e. to the right of the vertical line in FIG. 13(H), a varies within a limited range. In Table 1, "mean" represents the average value of a for the 100 runs after convergence. "σ" in Table 1, represents the standard deviation of "mean" over the 100 runs. "Min" represents the lowest value of "mean" over the 100 runs and "Max" represents the highest value of "mean" over the 100 runs. "−3σ" is "mean"−3 times "σ". "+3σ" is "mean"+3 times "σ". It can be seen that the lowest value of "mean" is obtained with GAIN=0.125 but "σ" is less good in comparison with other GAIN values. Also, the −3σ and +3σ points for GAIN=0.125 are beyond Min and Max suggesting that the distribution is non-Gaussian. This non-Gaussian distribution may suggest that certain sets of threshold voltage variation will be difficult for the algorithm to cope with. This might affect the manufacturing yield, because some manufactured devices will have at least one segment whose threshold voltage variations cannot be adequately compensated for. The distribution for GAIN=0.25 is closer to Gaussian and "mean" and "σ" are also acceptable.

In terms of convergence time, simulation results suggest that the mean number of transistor adjustments in total will be 1840. The minimum number was 440 adjustments and the maximum number was 4850 adjustments. The number of comparison operations is seven times larger than this, i.e. typically around 13,000, with minima and maxima of around 3,000 and around 34,000 respectively. Assuming that the circuitry is used in a segmented DAC having 80 segments, the total number of comparisons would be around 1 million on average, with minima and maxima of around 250,000 and 2.7 million respectively.

Incidentally, although not shown in FIG. 12, it will be appreciated that the same GAIN parameter may be employed in both the main adjustment section 70 and the reference adjustment section 72. However, it could be advantageous to employ different GAIN values in the two sections, for example to make one converge before the other. Additionally, the GAIN value or values could be dynamically adjusted, for example to initially approach convergence rapidly and then settle more stably.

In the FIG. 12 circuitry, the transistors S1 to S8 are not disconnected from the output nodes when they are being calibrated. This has implications for the operation of the circuitry and the compensation section 80 is provided to compensate for the effects of the calibration process on the outputs. When the two transistors that are turned on in a given comparison are connected to two different output nodes (e.g. the transistors S1 and S2), approximately half the current flows to each output node (I/2+any error which will be very small after convergence). In this case, therefore, there is no differential output current (or just that due to residual transistor mismatch after calibration). However, in three out of the seven possible cases, the two transistors that are on are connected to the same output node (e.g. the transistors S1 and S3). In this case, all of the current I sunk by the current sink 82 flows to one output node.

When two transistors undergoing calibration are connected to the same output node, the compensation section 80 causes an additional current I to flow through the other output node (e.g. OUTB in the case in which the two transistors are connected to the output node OUTA).

It is also undesirable for the total current through either output node to vary according to whether or not the two transistors that are turned on are on the same or different output nodes. For this reason, the compensation section 80 also causes an additional current of I/2 to flow through both output nodes (OUTA and OUTB) in the case in which the two transistors that are turned on for calibration purposes are connected to different output nodes (e.g. the switches S1 and S2). Accordingly, the compensation section 80 needs to be capable of causing an additional current I to flow through either output or an additional current of I/2 to flow through both outputs depending on which of the transistors are being subjected to calibration. The function of the compensation section 80 could be performed by another segment. That further segment could itself be a calibrated segment.

In FIG. 12, the resolution of each DAC may need to be around 8 bits. The accumulators may need to have 16 bits.

Although FIG. 12 shows a separate DAC connected to each of the accumulators, it is possible to share a DAC between two or more accumulators. For example, it would be possible to provide each transistor S1 to S8 (and each transistor 94-1 to 94-8) with its own track-and-hold circuit as shown in FIG. 14. In this case, each transistor S1 to S8 receives its adjustable bulk voltage $V_{B1}$ to $V_{B8}$ from a corresponding track-and-hold circuit $110_1$ to $110_8$. Each track-and-hold circuit comprises an input switch $112_1$ to $112_8$ and a capacitor $114_1$ to $114_8$. The track-and-hold circuits $110_1$ to $110_8$ are connected in common to an analog output of a DAC 120 used in place of the DACs 91-1 to 91-8 in FIG. 12. The DAC 120 has a digital input which is connected to each of the accumulators 90-1 to 90-8 in FIG. 12 (shown collectively as a block of accumulators 130 in FIG. 14). When it is desired to change the bulk voltage applied to one of the transistors S1 to S8, the relevant accumulator value is updated by the control section 78.

The accumulators 90-1 to 90-8 are connected one after the other to the input of the DAC 120. The relevant one of the switches $112_1$ to $112_8$ is then closed, the remaining switches being kept open. Accordingly, the analog output of the DAC 120 is applied to the capacitor in the track-and-hold circuit whose input switch is closed. The capacitor stores the analog output of the DAC. This stored voltage is then supplied as the adjusted bulk voltage to the relevant one of the transistors.

In this way, a single DAC can be used to generate the bulk voltages for a plurality of different transistors. In a segmented architecture, for example, a single DAC could even be used to supply bulk voltages to transistors in all of the segments. Alternatively, a single DAC could be used per group of segments, for example for every four segments.

The DAC 120 need not be particularly complicated. For example, one possibility would be a resistor ladder 190 with $2^n$ resistors R1 to Rn connected in series, as shown in FIG. 15. Outputs L1 to Ln−1 could then be taken from the nodes at which the series resistors are connected together. The outputs could be selected using a binary switch tree arrangement 200, as shown in FIG. 16. The required number of switches in the tree arrangement is $2^{n+1}-2$. These switches can be of the minimum device size because they only have to drive the well of one of the transistors S1 to S8 whose bulk voltage is to be adjusted.

It would also be possible to construct a DAC using two resistor ladder arrangements 210 and 212 and as shown in FIG. 17. Each of the resistor ladder arrangements 210 and 212 would comprise n/2 resistors connected in series in the same manner as shown in FIG. 15. The outputs from each ladder would be selected using a binary switch tree arrangement as shown in FIG. 16.

The section 210 corresponds to the n/2 most significant bits of the DAC. The output of the binary switch tree in the section 210 is connected via a resistor R to an output node OUT of the DAC. The section 212 corresponds to the n/2 least significant bits of the DAC. The output of the binary switch tree in the section 212 is connected to the output node OUT of the DAC by a resistor having the value $2^{n/2}R$. In this way, the resolution of the DAC is n bits but the total number of switches is in the binary switch trees is reduced. For example, when n=10, the required number of switches is $2(2^6-2)=124$, whereas in the FIG. 16 arrangement $2^{11}-2=2046$ switches would be needed. Similarly, the number of resistors required is $2 \times 2^5=64$, as compared to $2^{10}=1024$.

In the preceding embodiments of the invention, the adjustment circuit adjusts the bulk voltages of the transistors to equalise their respective switching delays. However, instead of (or in addition to) adjusting the bulk voltages it is possible to adjust the gate voltages of the transistors to achieve the intended equalisation. This is the approach adopted in a further embodiment of the present invention shown in FIG. 18. In FIG. 18, an adjustment circuit 312A is connected between a first input node, at which an input signal INA is received, and a gate of a first FET S1. Another adjustment circuit 312B is connected between a second input node, at which an input signal INB (complementary to the input signal INA) is received, and a gate of a second FET S2. Each adjustment circuit 312A or 312B supplies a gate voltage to the transistor S1 or S2 based on the input signal INA or INB. In this case, the adjustment circuit can adjust the gate voltage to compensate for threshold voltage variations (and other variations such as a gain error) which affect the transistor's switching delay. The measurement techniques used to effect such gate-voltage adjustment can be the same as in the preceding embodiments.

The invention claimed is:

1. A digital-to-analog converter, comprising:
   a first field-effect transistor;
   a second field-effect transistor; and
   adjusting means for adjusting a factor applied to one of the first and second field-effect transistors separately from the same factor applied to the other one of the first and second field-effect transistors so as to tend to equalise respective switching delays of the transistors, the factor being a bulk voltage and/or a gate voltage,
   wherein the adjusting means comprises measuring means operable to measure a predetermined property of each of the first and second field-effect transistors, the adjusting means being operable to adjust the bulk voltage applied to at least one of the first and second field-effect transistors so as to tend to equalise the measured property for both field-effect transistors.

2. A digital-to-analog converter as claimed in claim 1, wherein said measuring means are operable to substantially equalise respective input conditions of the first and second field-effect transistors when measurements of the predetermined property are taken.

3. A digital-to-analog converter as claimed in claim 1 or 2, wherein the measuring means are operable to compare the measured property of the first field-effect transistor with a reference value for the property and to adjust the factor applied to the first field-effect transistor so as to tend to make the measured property of the first field-effect transistor equal to the reference value, and are further operable to compare the measured property of the second field-effect transistor with said reference value and to adjust the factor applied to the second field-effect transistor so as to tend to make the measured property of the second field-effect transistor equal to the reference value.

4. A digital-to-analog converter as claimed in claim 1 or 2, wherein said first field-effect transistor is connected between a first node and a common node and said second field-effect transistor is connected between a second node and said common node.

5. A digital-to-analog converter as claimed in claim 1, having a plurality of such first field-effect transistors, each connected between a first node and a common node, and also having a plurality of such second field-effect transistors, each connected between a second node and said common node, the adjusting means being operable to adjust the factor applied to all, or all but one, of the first and second field-effect transistors so as to tend to equalise respective switching delays of the first and second field-effect transistors.

6. A digital-to-analog converter as claimed in claim 5, wherein the measuring means are operable to measure a predetermined property of each of the first and second field-effect transistors, the adjusting means being operable to adjust the factors applied respectively to the field-effect transistors so as to tend to equalise the measured property for those field-effect transistors.

7. A digital-to-analog converter as claimed in claim 6, wherein the measuring means are operable to compare the measured property of each field-effect transistor with a reference value for the property and to adjust the factor applied to the field-effect transistor concerned so as to tend to make the measured property of that field-effect transistor equal to the reference value.

8. A digital-to-analog converter as claimed in claim 5, wherein the measuring means are operable, for a target one of the first and second field-effect transistors, to select a plurality of different pairs of field-effect transistors, each different pair including the target field-effect transistor, and to measure a predetermined property of the circuitry for each said different pair, the adjusting means being operable to adjust the factor applied to at least the target field-effect transistor in dependence upon the measurement results.

9. A digital-to-analog converter as claimed in claim 8, wherein the measuring means comprise comparing means for comparing the measured property of the circuitry for each said different pair with a reference value, the adjusting means being operable to adjust the factor applied to said target field-effect transistor in dependence upon the comparison results.

10. A digital-to-analog converter as claimed in claim 9, wherein the adjusting means are operable to adjust the factor applied to the target field-effect transistor in dependence only upon the signs of the comparison results.

11. A digital-to-analog converter as claimed in claim 8, 9 or 10, wherein the adjusting means are also operable to adjust the factor applied to one or more field-effect transistors other than the target transistor in dependence upon the measurement results.

12. A digital-to-analog converter as claimed in claim 11, wherein the adjusting means are operable to maintain an average value of the factors applied to the pluralities of first and second field-effect transistors approximately the same as the individual values of the factors of those transistors are adjusted.

13. A digital-to-analog converter as claimed in claim 11, wherein the reference value is also adjusted when the factor of said one or more transistors are adjusted.

14. A digital-to-analog converter as claimed in any one of claims 8 to 10, further comprising reference generating means comprising at least one reference field-effect transistor and also comprising means for adjusting the factor applied to the or each said reference field-effect transistor so as to adjust said reference value.

15. A digital-to-analog converter as claimed in claim 5, wherein the measuring means are operable, for a target field-effect transistor among said pluralities of first and second field-effect transistors, to select a group of field-effect transistors including the target field-effect transistor, and to measure a predetermined property of the target field-effect transistor over a series of different measurement phases, the adjusting means being operable to the factor of at least the target transistor of the group in dependence upon the measurement results over said series.

16. A digital-to-analog converter as claimed in claim 15, wherein the adjusting means are operable to adjust the factor of the target field-effect transistor in dependence upon an average value of the measurement results over the series of measurement phases.

17. A digital-to-analog converter as claimed in claim 15 or 16, wherein, when the target field-effect transistor is one of the first field-effect transistors, each other field-effect transistor of the group is one of the second field-effect transistors, and, when the target field-effect transistor is one of the second field-effect transistors, each other field-effect transistor of the group is one of the first field-effect transistors.

18. A digital-to-analog converter as claimed in any one of claims 15 to 16, wherein the measured property for the target transistor is scaled upwardly according to the number of other field-effect transistors in the group.

19. A digital-to-analog converter as claimed in any one of claims 2 and 5 to 10, wherein the measuring means are adapted to make input conditions of the field-effect transistors being subjected to measurement substantially the same as input conditions thereof during normal operation of the circuitry.

20. A digital-to-analog converter as claimed in any one of claims 2, 5-10, and 15 and 16, wherein the measuring means comprise means for isolating one or more terminals of the field-effect transistors from remaining parts of the circuitry when the measurements are being taken.

21. A digital-to-analog converter as claimed in any one of claims 2, 5-10, and 15 and 16, wherein said predetermined property is a current flowing through the field-effect transistor.

22. A digital-to-analog converter as claimed in any one of claims 5-10 and 15 and 16, wherein the predetermined property is a potential of said common node.

23. A digital-to-analog converter as claimed in any one of claims 2, 10, 15, and 16, wherein the measuring means comprise first and second measurement elements, and are operable to carry out a first measurement in which one of the two field-effect transistors being subjected to measurement is connected operatively to the first measurement element and the other one of those two field-effect transistor is connected operatively to the second measurement element, and to carry out a second measurement in which said other field-effect transistor is connected operatively to the first measurement element and said one field-effect transistor is connected operatively to the second measurement element.

24. A digital-to-analog converter as claimed in an one of claims 1, 2, 5-10 and 15, and 16, comprising a plurality of circuitry segments, each segment comprising at least first and second field-effect transistors, the adjusting means being operable to adjust the factor applied to at least one of the first and second field-effect transistors in each segment so as to tend to equalise respective switching delays of the field-effect transistors in the segment concerned.

25. A digital-to-analog converter as claimed in claim 24, wherein the adjusting means are operable to adjust the factor in at least one circuitry segment whilst the remaining circuitry segments remain in operation.

26. Switching circuitry, operative repetitively in a series of switching phases, the circuitry comprising:
at least one first field-effect transistor connected between a common node of the circuitry and a first node of the circuitry;
at least one second field-effect transistor connected between said common node and a second node of the circuitry;
switch control means connected with said first and second field-effect transistors and operable to cause the same number of field-effect transistors to change state in each said switching phase; and
adjusting means for adjusting a factor applied to each, or each but one, of the field-effect transistors, so as to tend to equalise respective switching delays of the transistors, the factor being a bulk voltage and/or a gate voltage.

27. Switching circuitry as claimed in claim 26, operative in repeating sequences of n phases, where n is an integer greater than 1, and having n first field-effect transistors and n second field-effect transistors.

28. A digital-to-analog converter comprising switching circuitry as claimed in claim 26 or 27.

29. A digital-to-analog converter comprising switching circuitry as claimed in claim 26, and having just one first field-effect transistor and just one second field-effect transistor, the switch control means being operable in a return-to-zero mode in which the number of changes of state of said first and second field-effect transistors is the same in each said switching phase.

30. An input circuit comprising:
an input node, at which an input signal is received;
first and second circuit sections;
a first field-effect transistor connected between the input node and said first circuit section;
a second field-effect transistor connected between the input node and said second circuit section;
control means connected with the first and second field-effect transistors for causing the first field-effect transistor to supply the input signal from the input node to the first circuit section in a first operating phase and for causing the second field-effect transistor to supply the input signal from the input node to the second circuit section in a second operating phase; and
adjusting means for adjusting a factor applied to one or both of said first and second field-effect transistors so as to tend to equalise respective switching delays of the two transistors, the factor being a bulk voltage and/or a gate voltage.

31. An output circuit comprising:
an output node, at which an output signal is received;
first and second circuit sections;
a first field-effect transistor connected between the output node and said first circuit section;
a second field-effect transistor connected between the output node and said second circuit section;
control means connected with the first and second field-effect transistors for causing the first field-effect transistor to supply the output signal from the first circuit section to the output node in a first operating phase and for causing the second field- effect transistor to supply the output signal from the second circuit section to the output node in a second operating phase; and
adjusting means for adjusting a factor applied to one or both of said first and second field-effect transistors so as to tend to equalise respective switching delays of the two transistors, the factor being a bulk voltage and/or a gate voltage.

* * * * *